(12) United States Patent
Masuoka et al.

(10) Patent No.: US 9,755,053 B2
(45) Date of Patent: Sep. 5, 2017

(54) SEMICONDUCTOR DEVICE HAVING FIN-SHAPED SEMICONDUCTOR LAYER

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/467,676

(22) Filed: Mar. 23, 2017

(65) Prior Publication Data

US 2017/0194460 A1    Jul. 6, 2017

Related U.S. Application Data

(60) Division of application No. 15/143,732, filed on May 2, 2016, now Pat. No. 9,640,628, which is a (Continued)

(51) Int. Cl.
*H01L 21/00* (2006.01)
*H01L 29/66* (2006.01)
(Continued)

(52) U.S. Cl.
CPC ......... *H01L 29/66666* (2013.01); *H01L 21/823431* (2013.01); *H01L 21/823821* (2013.01);
(Continued)

(58) Field of Classification Search
CPC ......... H01L 29/66545; H01L 29/66795; H01L 21/823431; H01L 21/823821; H01L 27/0924; H01L 21/845; H01L 27/1211
See application file for complete search history.

(56) References Cited

U.S. PATENT DOCUMENTS 6,891,234 B1    5/2005 Connelly et al.
8,564,034 B2   10/2013 Masuoka et al.
(Continued)

FOREIGN PATENT DOCUMENTS

JP    H02-71556 A    3/1990
JP    H02-188966 A   7/1990
(Continued)

OTHER PUBLICATIONS

Mistry, K., et al., "A 45nm Logic Technology with High-k+Metal Gate Transistors, Strained Silicon, 9 Cu Interconnect Layers, 193nm Dry Patterning, and 100% Pb-free Packaging", *Logic Technology Development*, *Components Research, #QRE, %TCAD, Intel Corp., Hillsboro, OR, U.S.A.
(Continued)

*Primary Examiner* — Ngan Ngo
(74) *Attorney, Agent, or Firm* — Brinks Gilson & Lione

(57) ABSTRACT

An SGT production method includes a first step of forming a fin-shaped semiconductor layer on a semiconductor substrate and forming a first insulating film; a second step of forming a pillar-shaped semiconductor layer, a first dummy gate, and a first hard mask formed from a third insulating film; a third step of forming a second hard mask on a side wall of the first hard mask, and forming a second dummy gate; a fourth step of forming a sidewall and forming a second diffusion layer; a fifth step of depositing an interlayer insulating film, exposing upper portions of the second dummy gate and the first dummy gate, removing the second dummy gate and the first dummy gate, forming a first gate insulating film, and forming a gate electrode and a gate line; and a sixth step of forming a first contact and a second contact.

9 Claims, 44 Drawing Sheets

Related U.S. Application Data continuation of application No. PCT/JP2014/053746, filed on Feb. 18, 2014.

(51) Int. Cl.
 *H01L 29/423* (2006.01)
 *H01L 21/8238* (2006.01)
 *H01L 21/8234* (2006.01)
 *H01L 27/092* (2006.01)

(52) U.S. Cl.
 CPC .... *H01L 27/0924* (2013.01); *H01L 29/42392* (2013.01); *H01L 29/66545* (2013.01); *H01L 29/66795* (2013.01)

(56) References Cited

U.S. PATENT DOCUMENTS

| | | | |
|---|---|---|---|
| 8,669,601 | B2 | 3/2014 | Masuoka et al. |
| 2010/0207201 | A1 | 8/2010 | Masuoka et al. |
| 2012/0181618 | A1 | 7/2012 | Masuoka et al. |
| 2013/0140627 | A1 | 6/2013 | Masuoka et al. |
| 2013/0153989 | A1 | 6/2013 | Masuoka et al. |
| 2013/0307037 | A1 | 11/2013 | Masuoka et al. |
| 2013/0320455 | A1* | 12/2013 | Cappellani ........ H01L 29/66795 257/368 |
| 2015/0303296 | A1* | 10/2015 | Masuoka .......... H01L 29/66666 257/401 |
| 2015/0325665 | A1* | 11/2015 | Masuoka ........ H01L 21/823431 257/329 |
| 2016/0247938 | A1* | 8/2016 | Masuoka ............ H01L 29/7827 |
| 2017/0047428 | A1 | 2/2017 | Masuoka et al. |
| 2017/0148913 | A1* | 5/2017 | Masuoka ............ H01L 29/7827 |

FOREIGN PATENT DOCUMENTS

| | | |
|---|---|---|
| JP | H03-145761 A | 6/1991 |
| JP | H11-297984 A | 10/1999 |
| JP | 2004-356314 A | 12/2004 |
| JP | 2009-070975 A | 4/2009 |
| JP | 2009-182317 A | 8/2009 |
| JP | 2011-040682 A | 2/2011 |
| JP | 2013-239622 A | 11/2013 |
| WO | WO 2014/024266 A1 | 2/2014 |

OTHER PUBLICATIONS

Wu, CC., et al., "High Performance 22/20nm FinFET CMOS Devices with Advanced High-K/Metal Gate Scheme". Research & Development, Taiwan Semiconductor Manufacturing Company No. 8, Li-Hsin Rd. 6, Hsinchu Science Park, Hsinchu, Taiwan, R.O.C., Tel. +886-3-5636688, Email: CCWUD@.tsmc.com.

English language translation of International Preliminary Report on Patentability for International Application No. Pc/JP2014/053746, dated Sep. 1, 2016, 7 pages.

\* cited by examiner

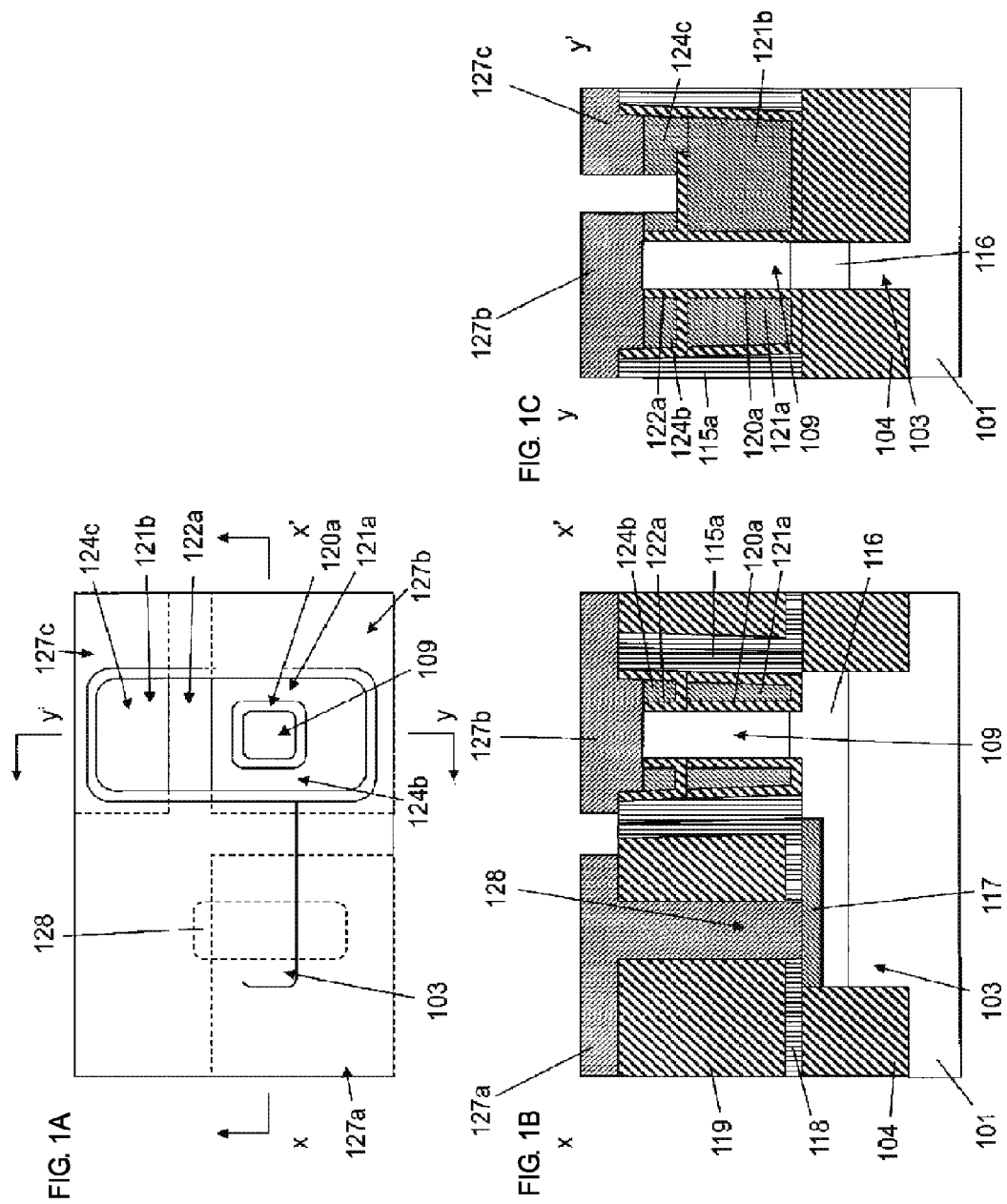

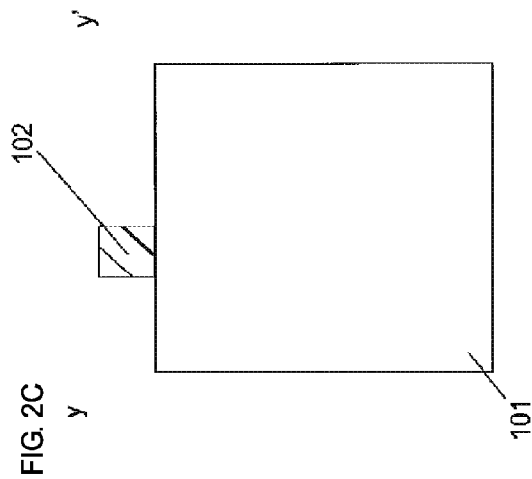
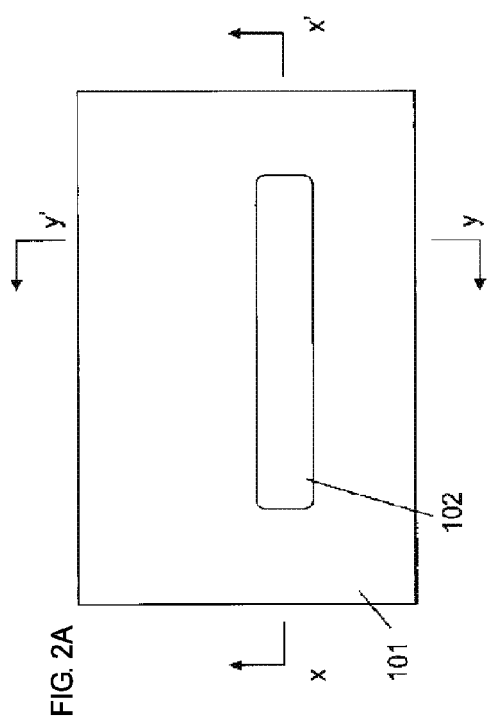
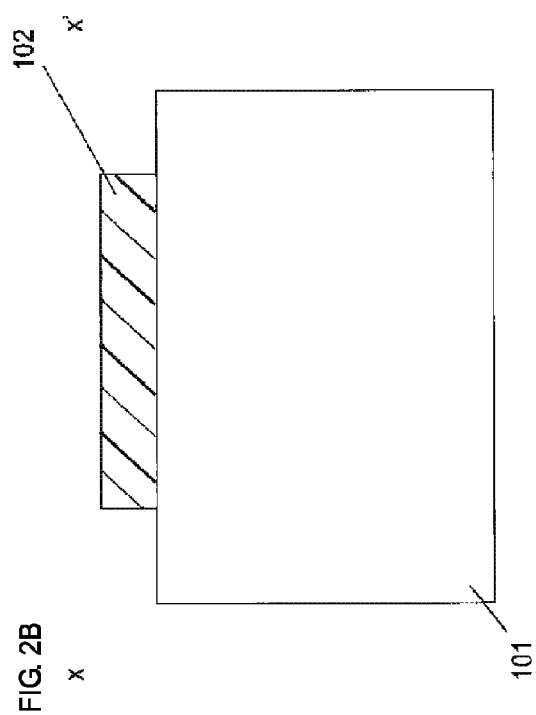

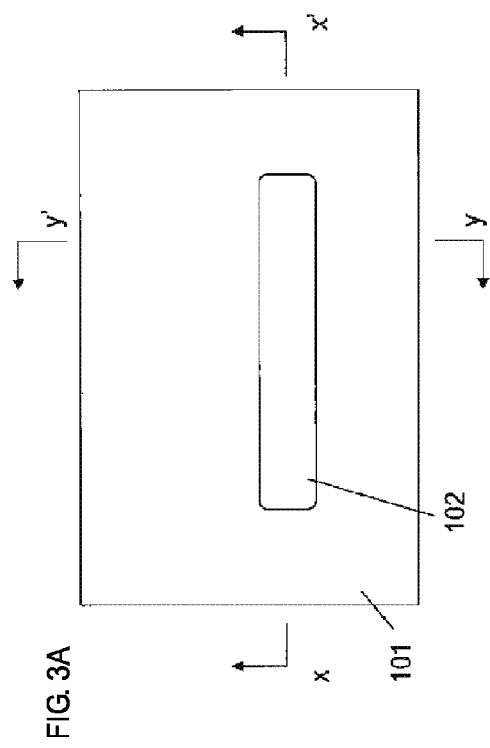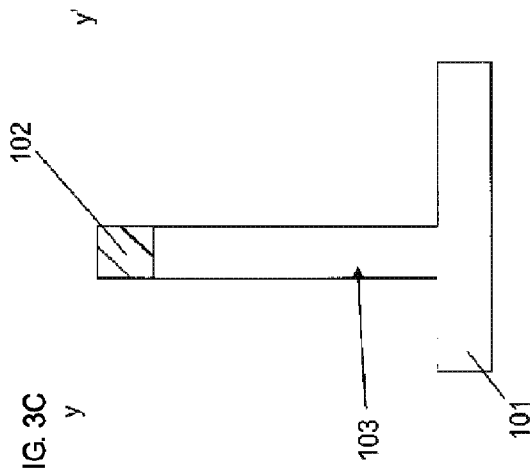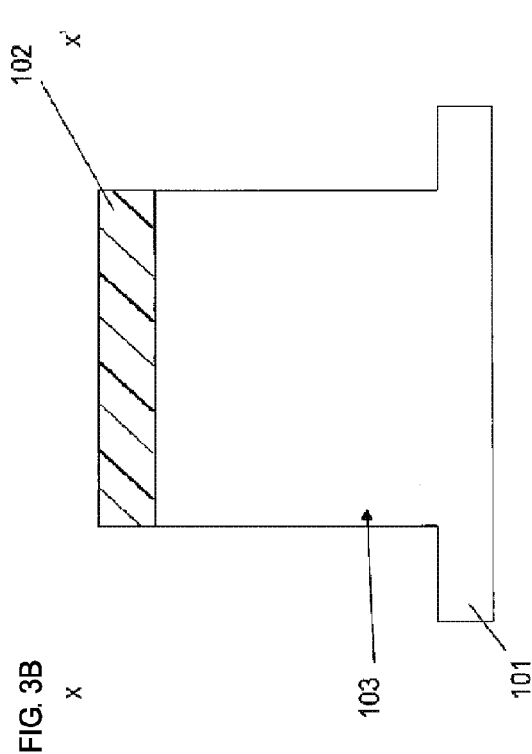

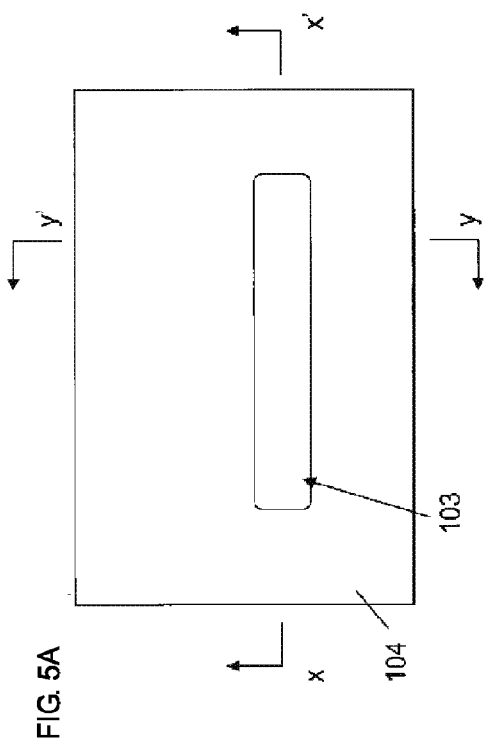
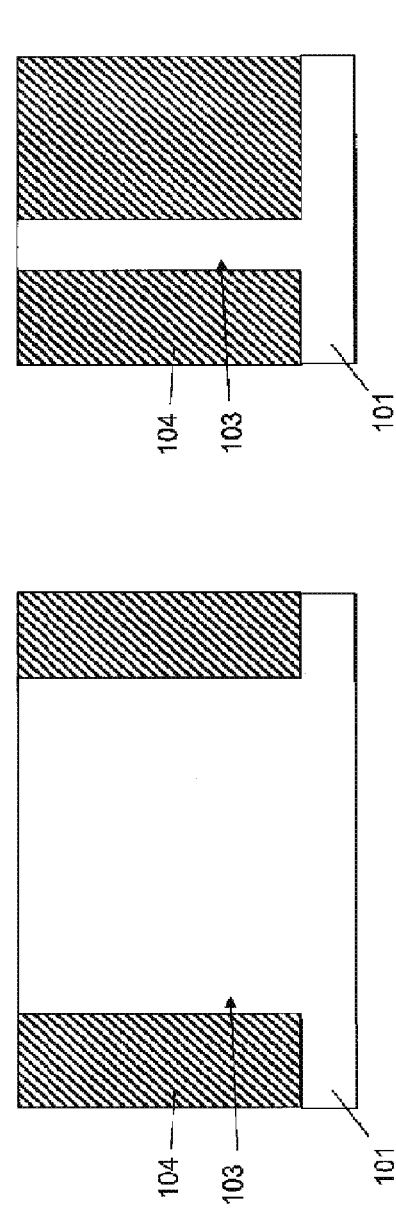
FIG. 5A
FIG. 5B
FIG. 5C

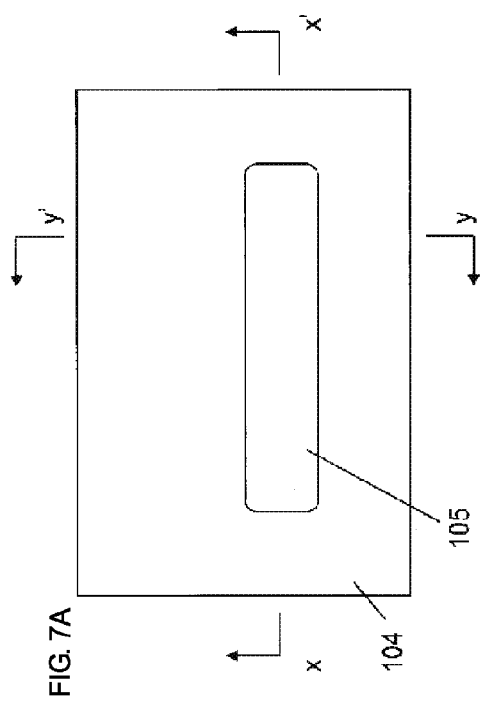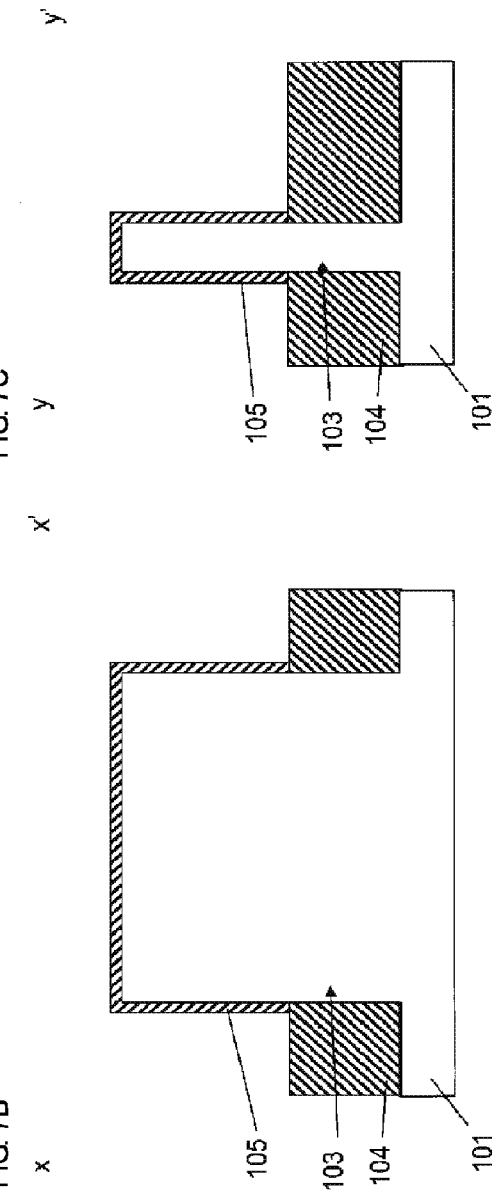

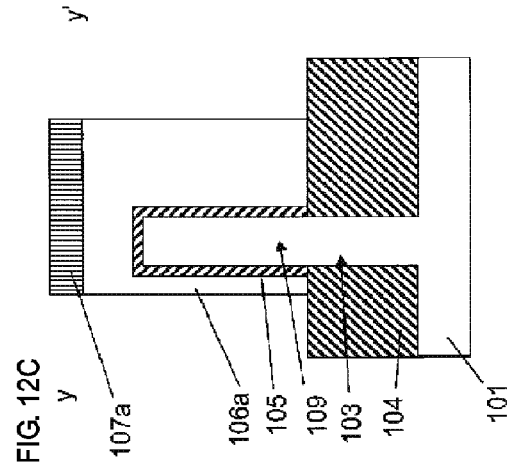
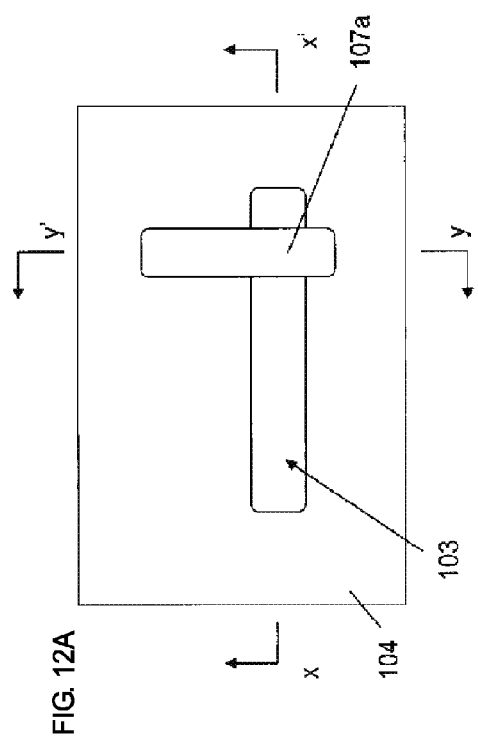
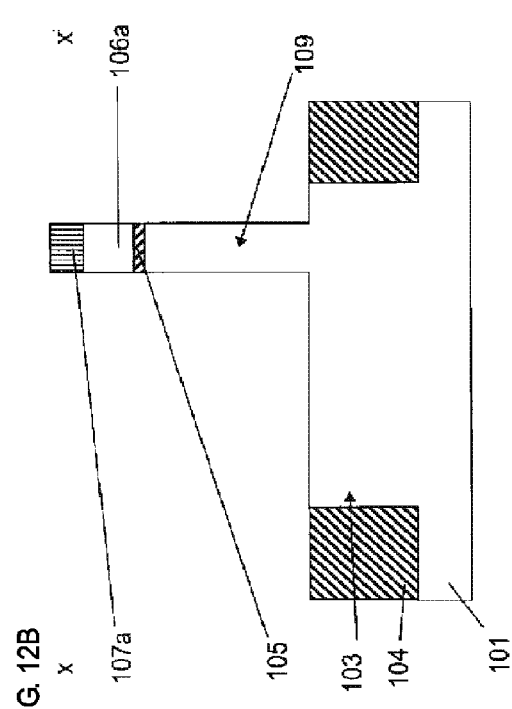

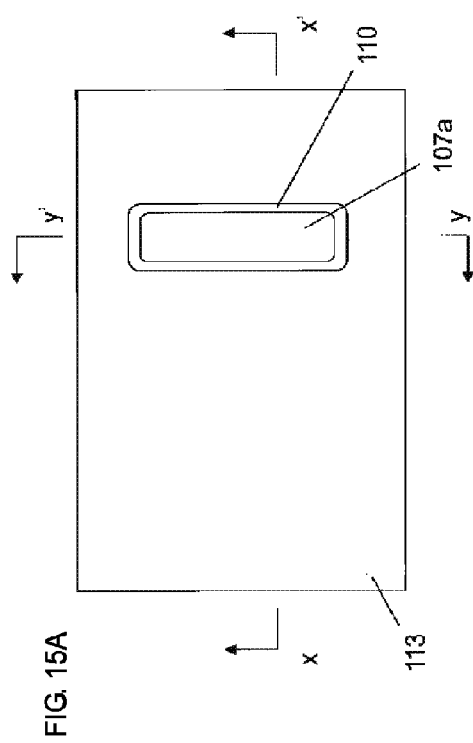
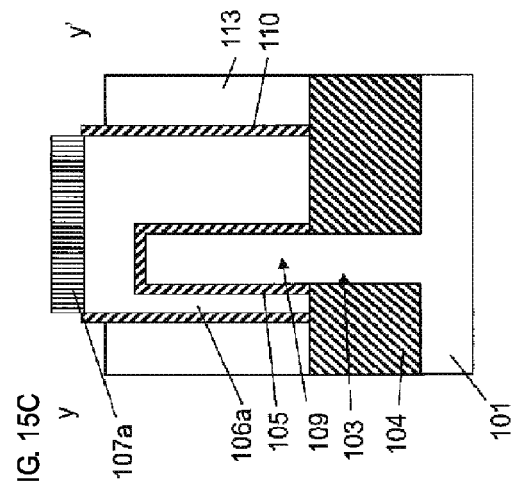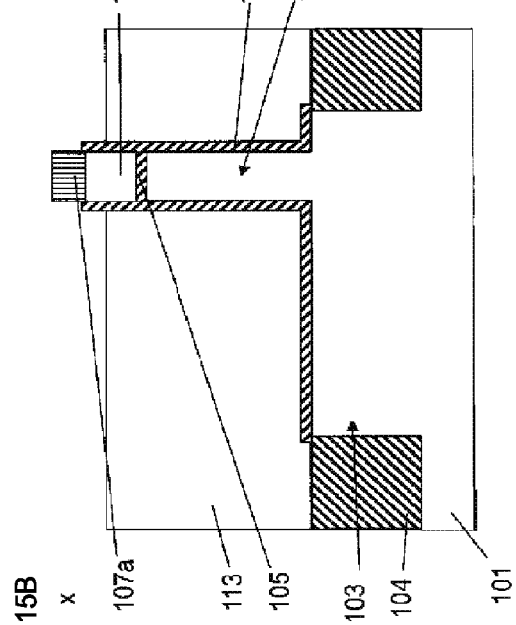

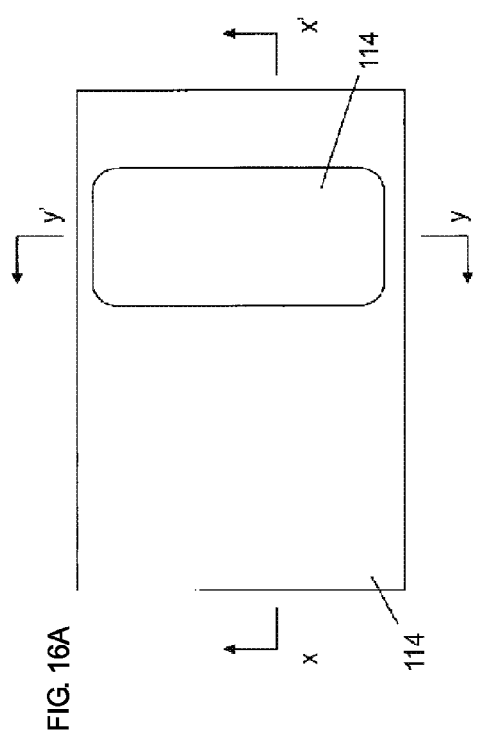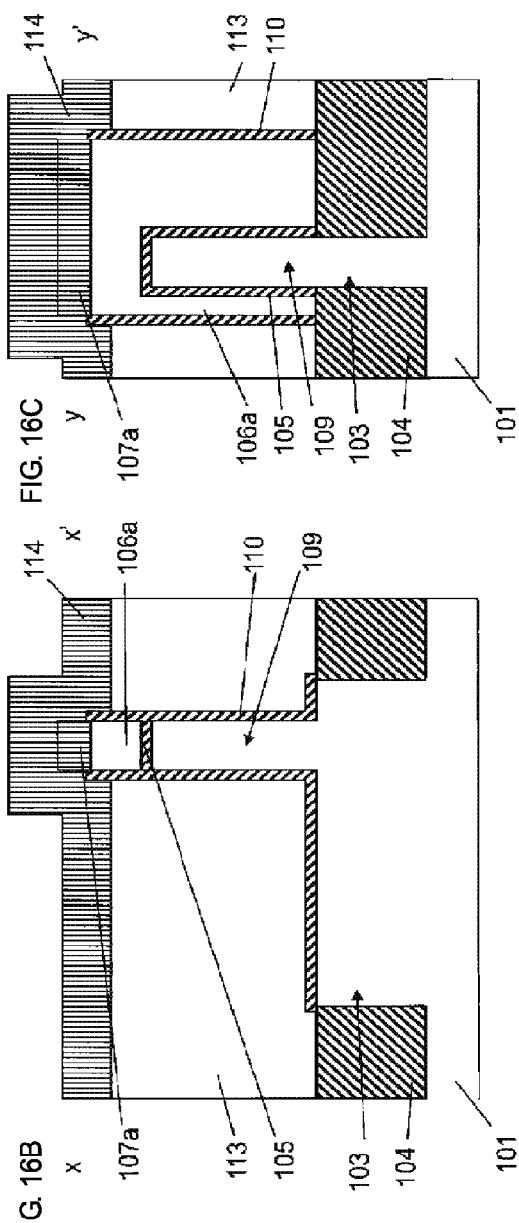

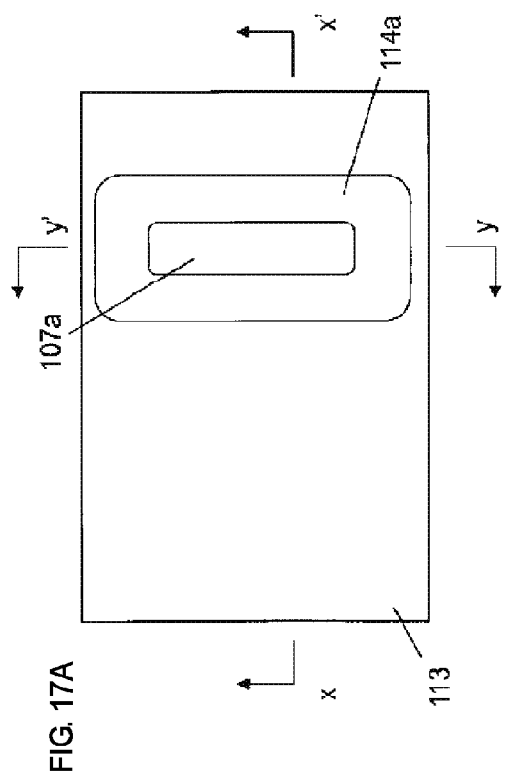
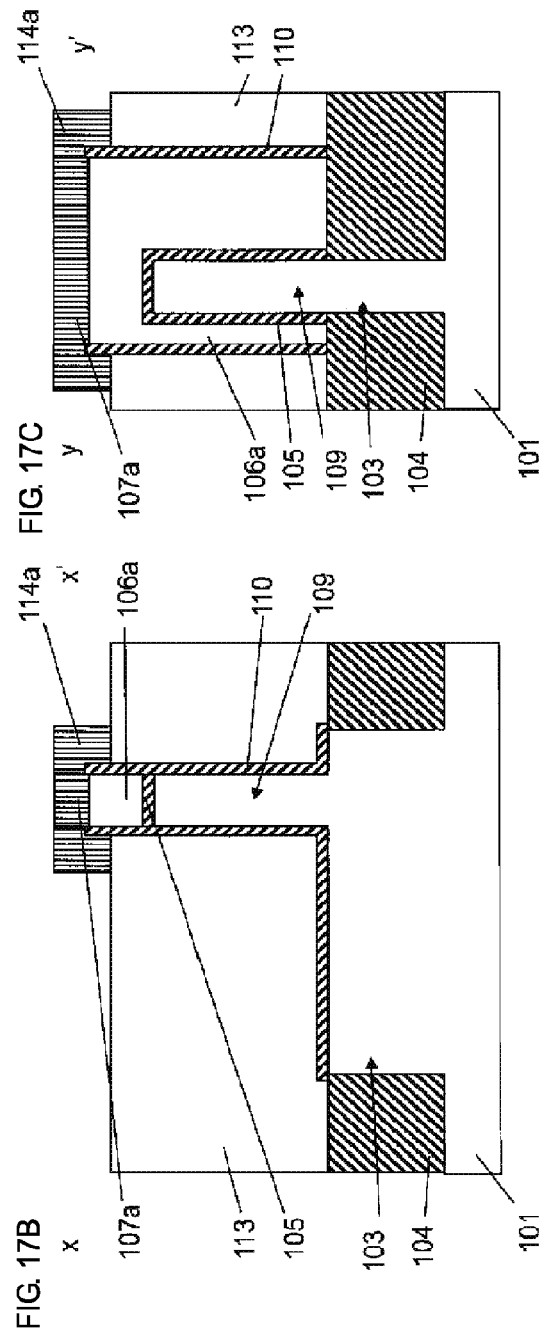

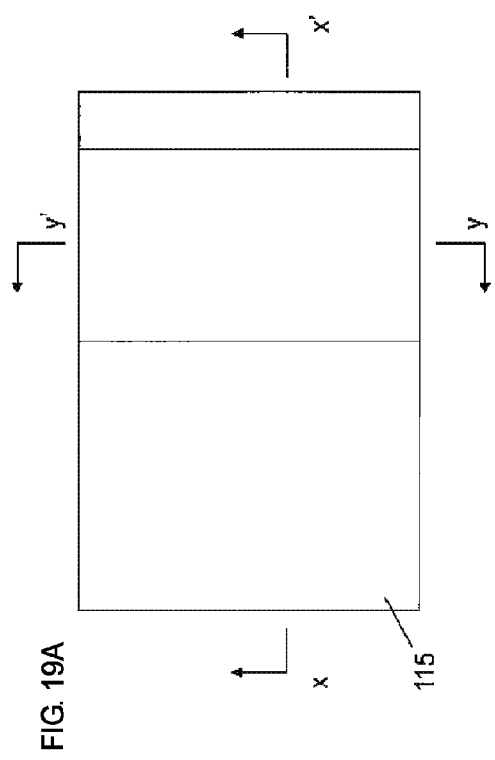
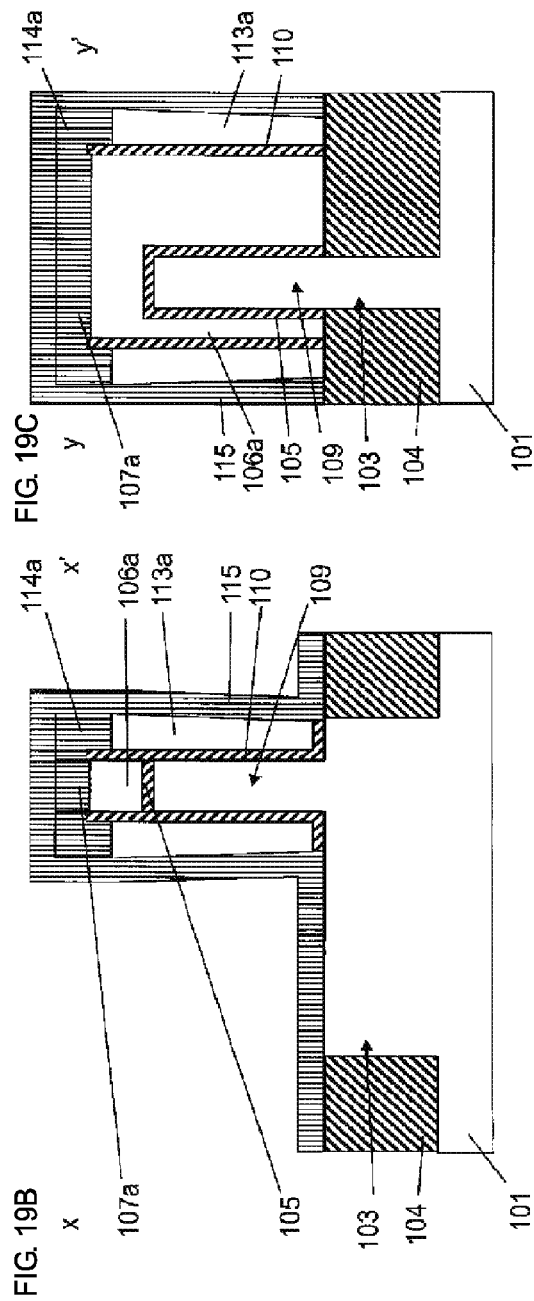
FIG. 19A
FIG. 19B
FIG. 19C

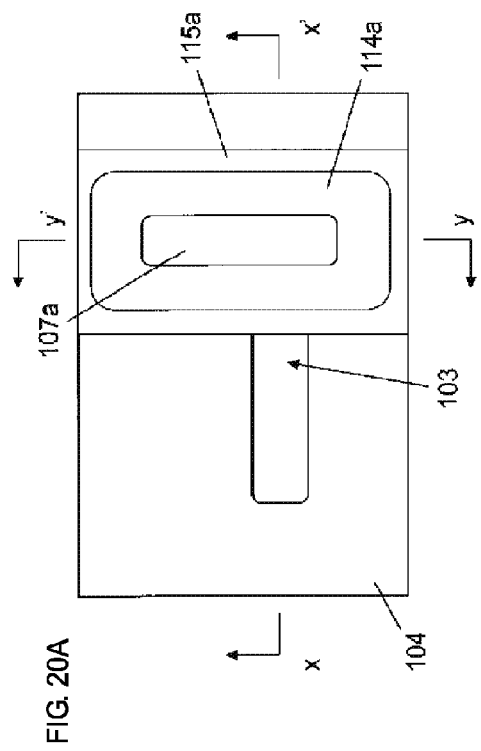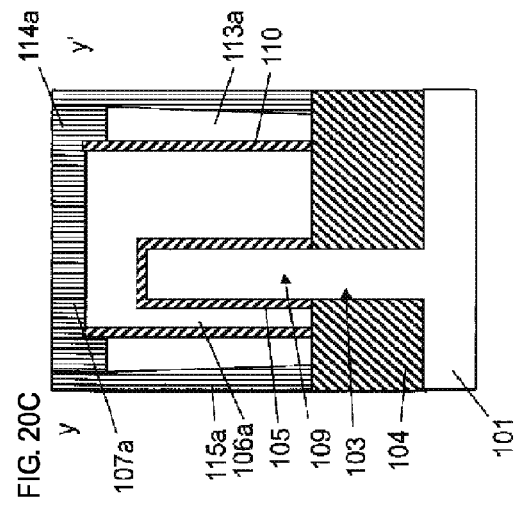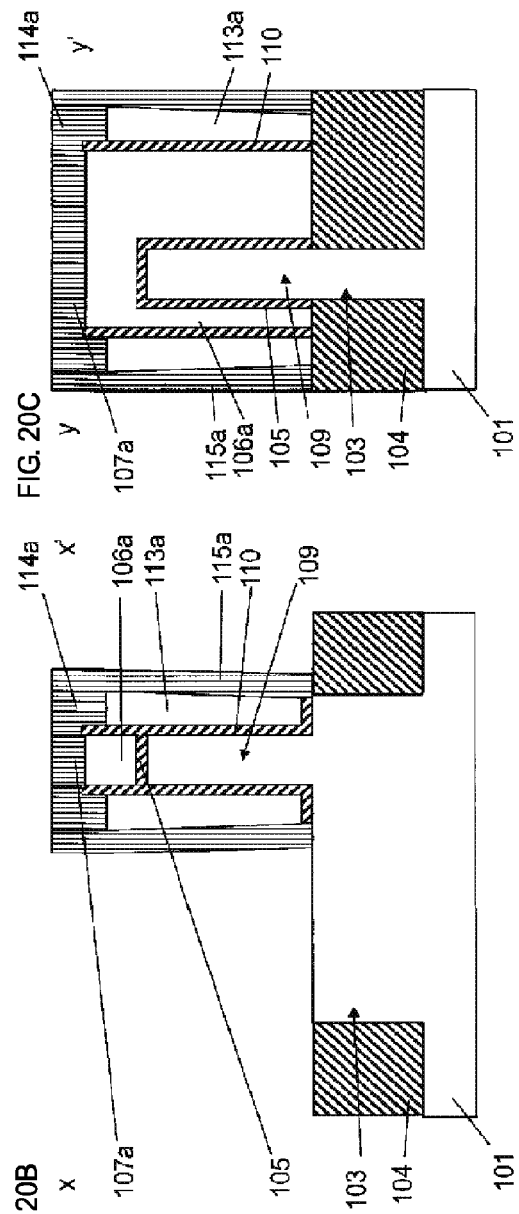

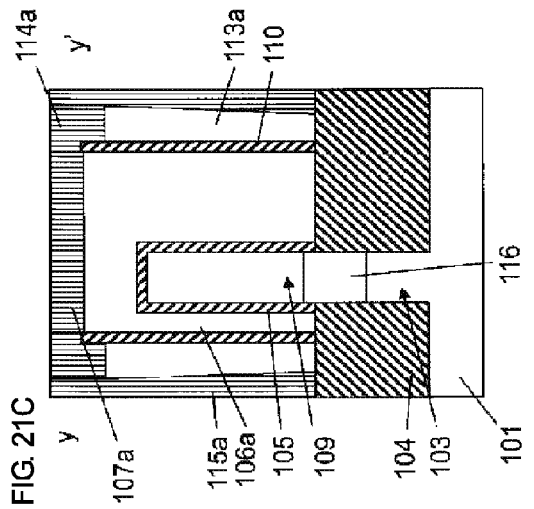
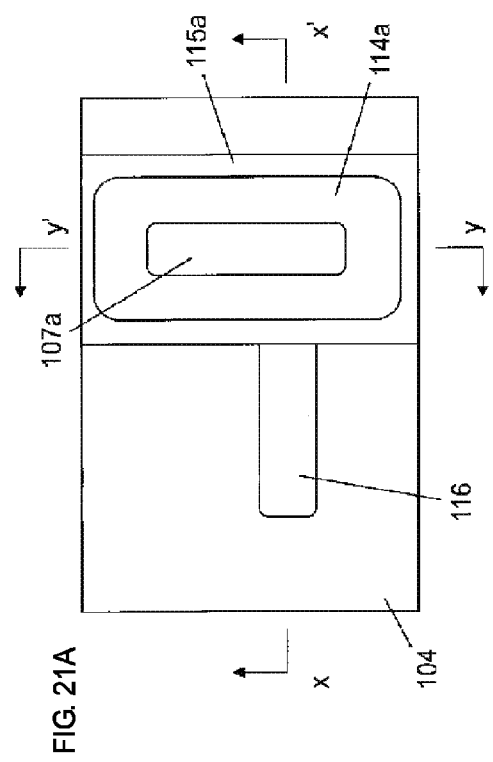
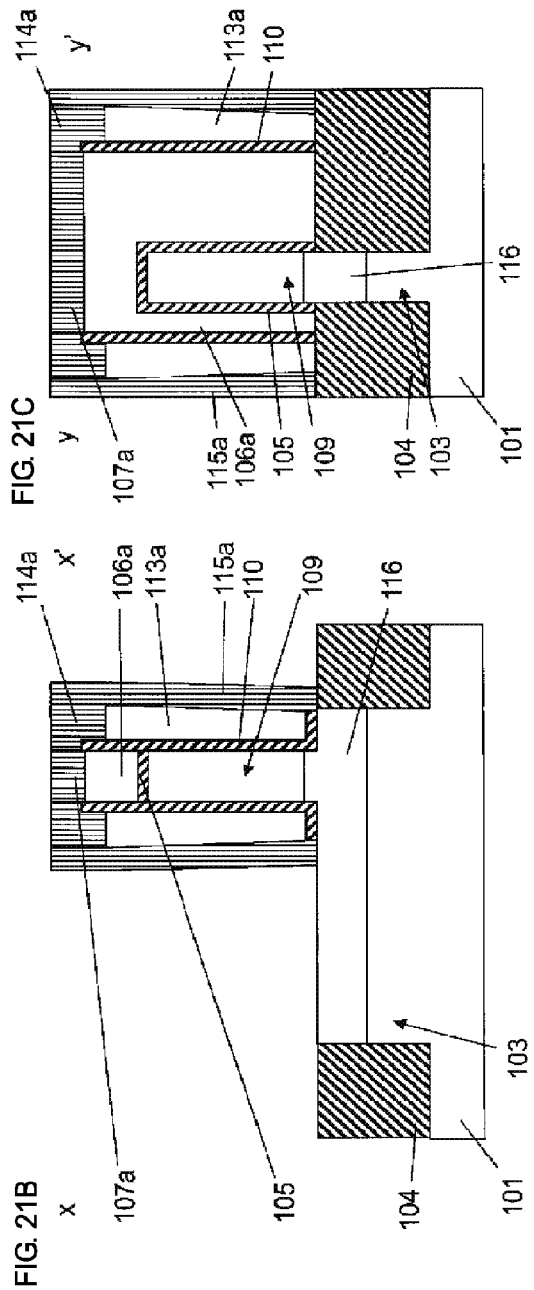

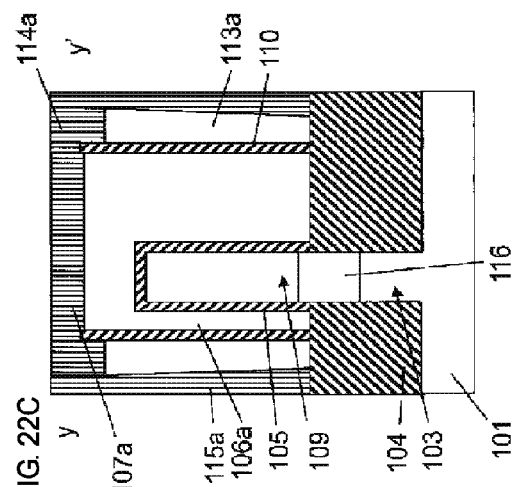
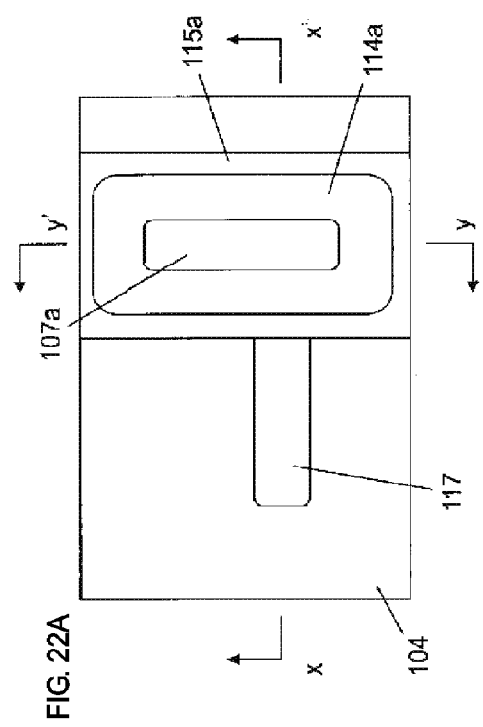
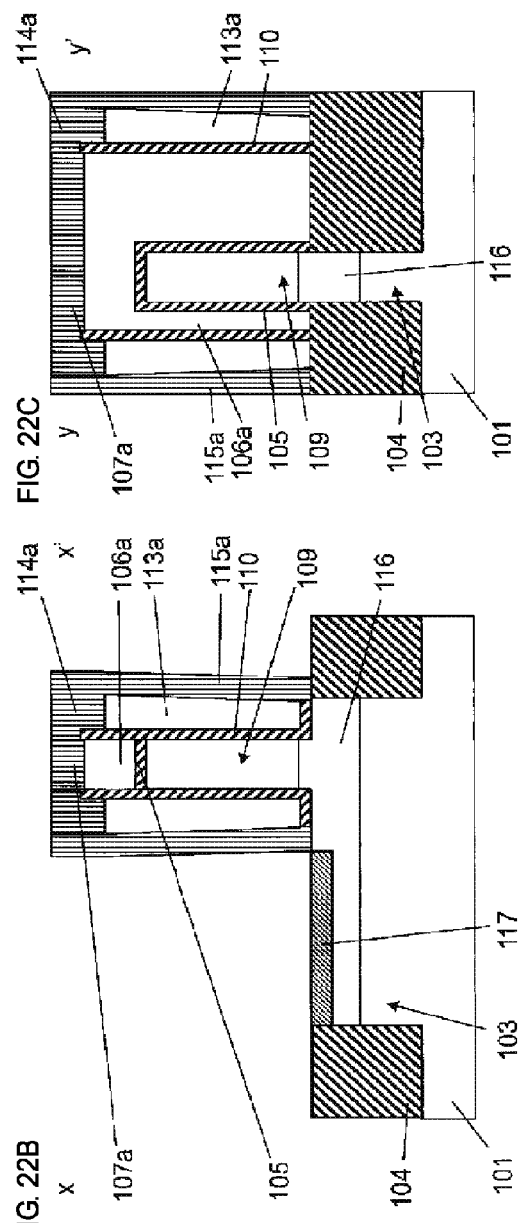

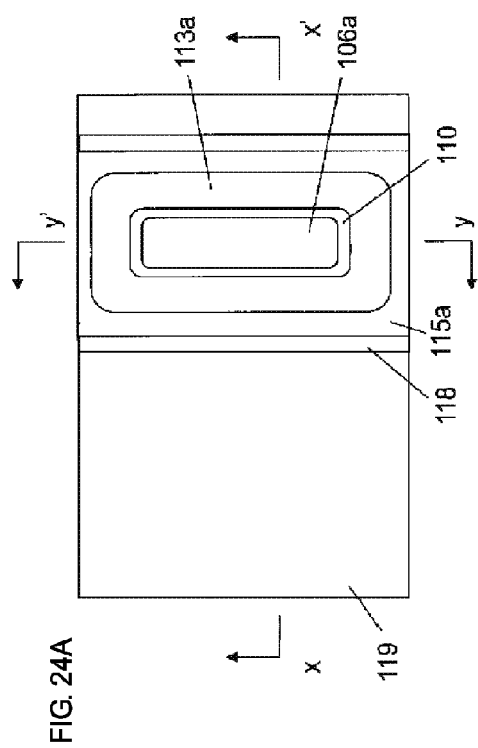
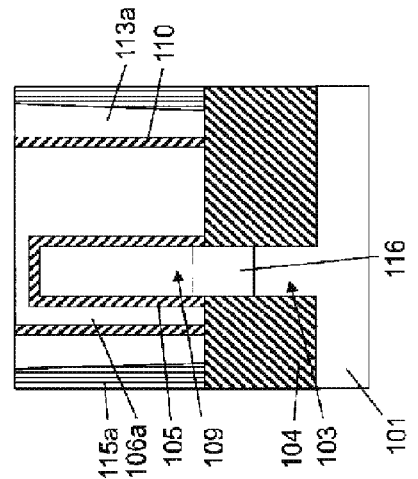
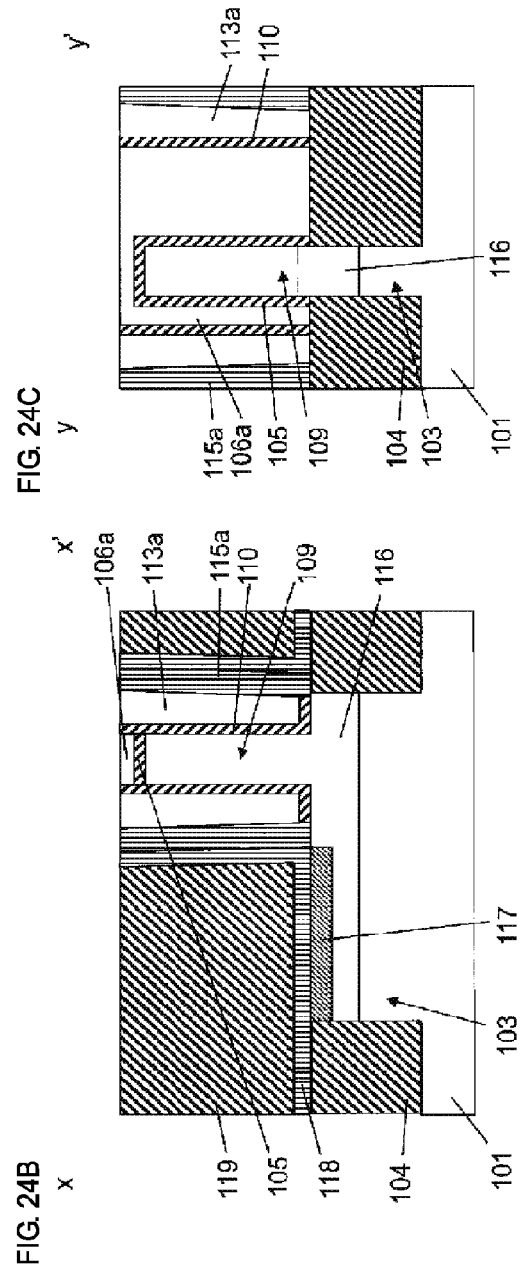

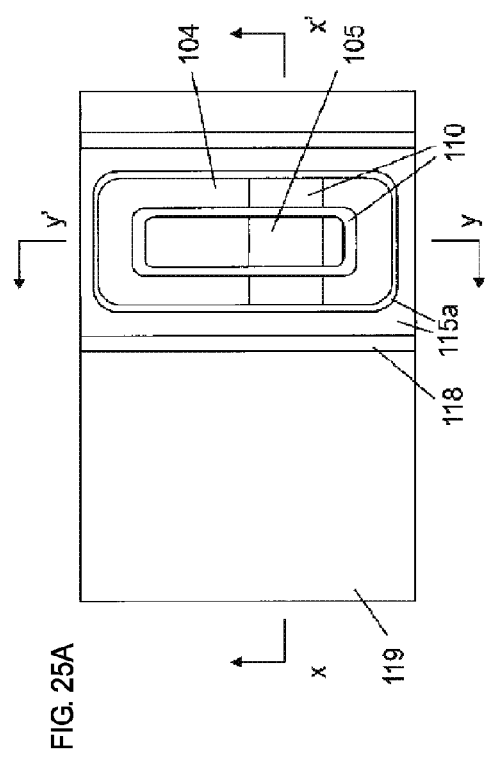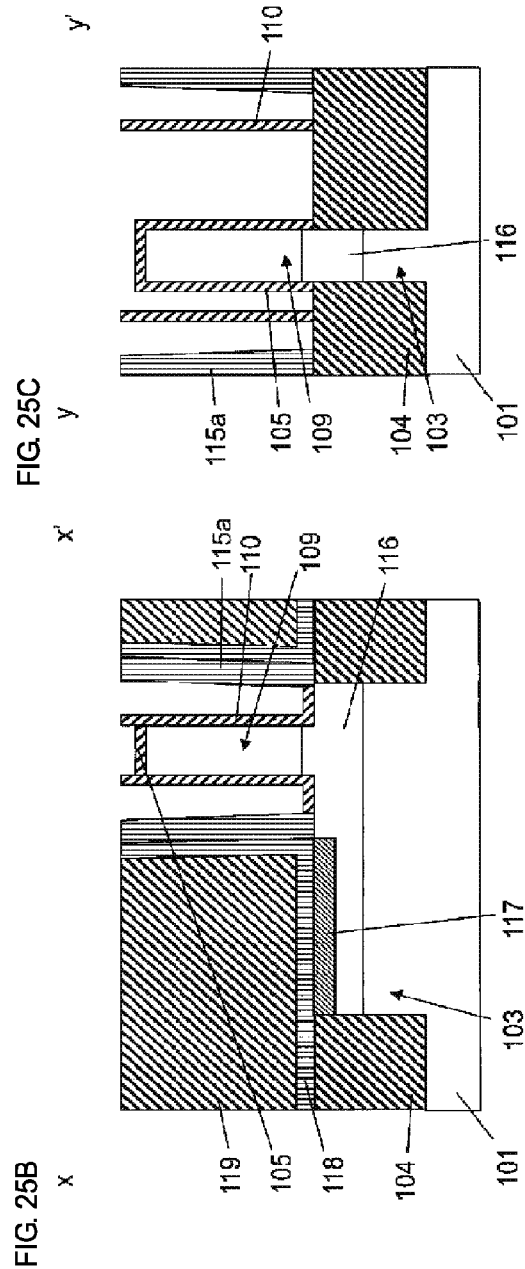

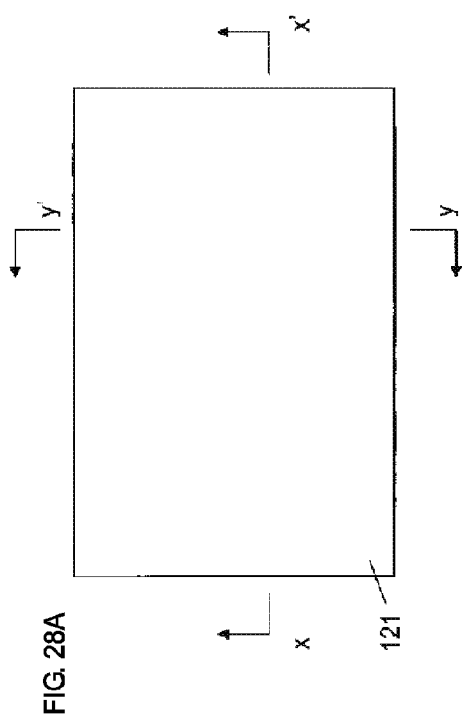
FIG. 28A
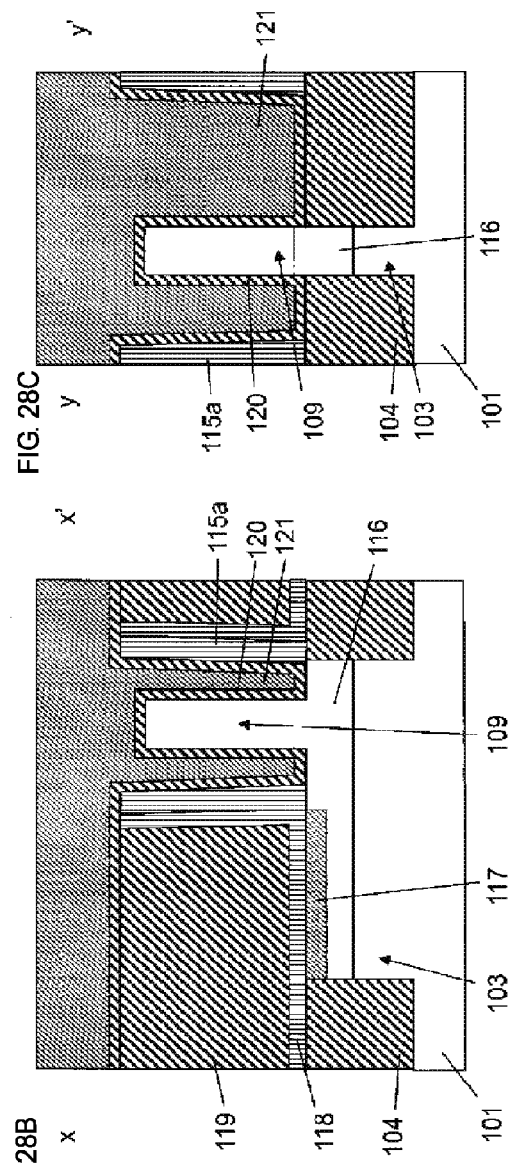
FIG. 28B
FIG. 28C

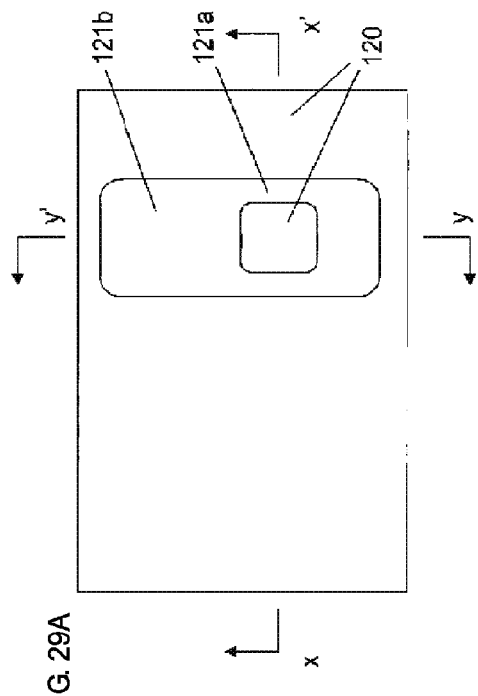
FIG. 29A
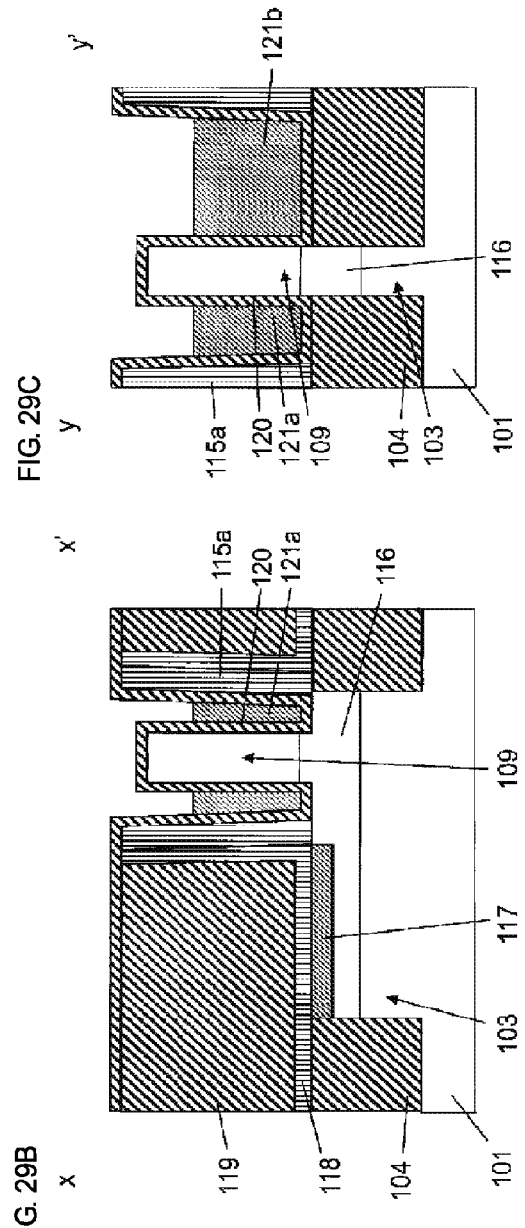
FIG. 29B
FIG. 29C

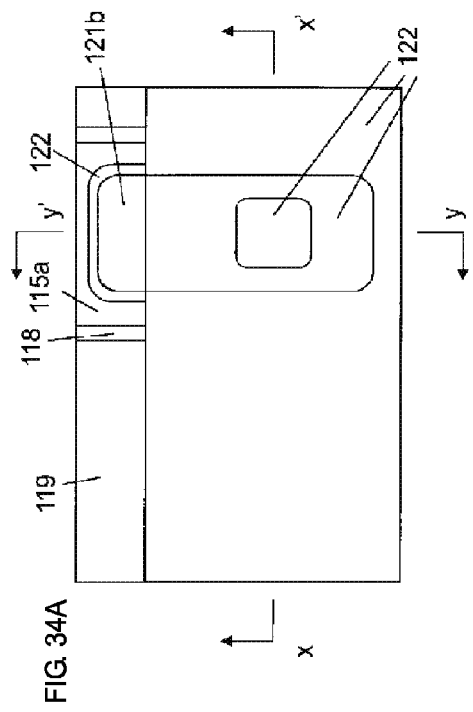
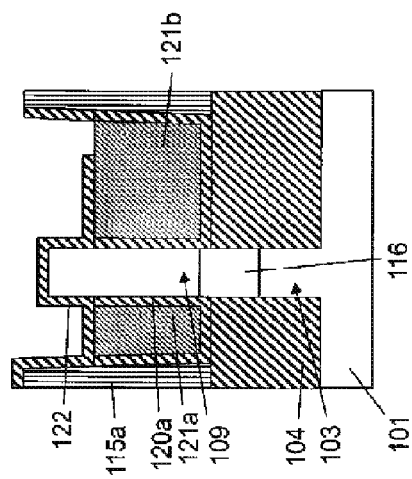
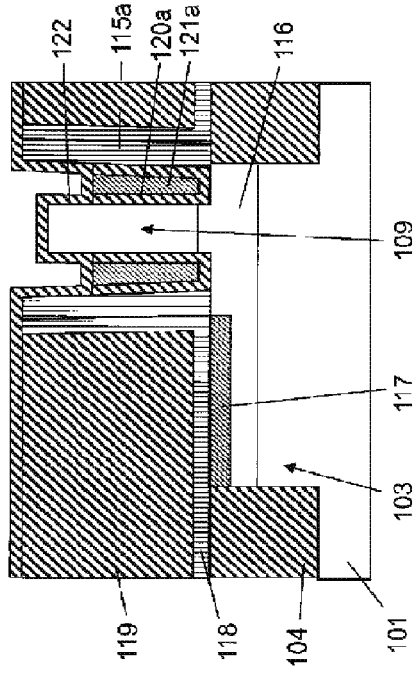
FIG. 34A
FIG. 34B
FIG. 34C

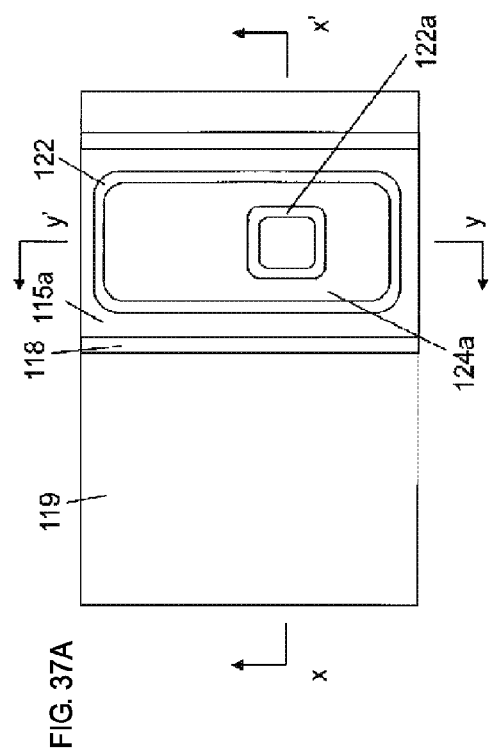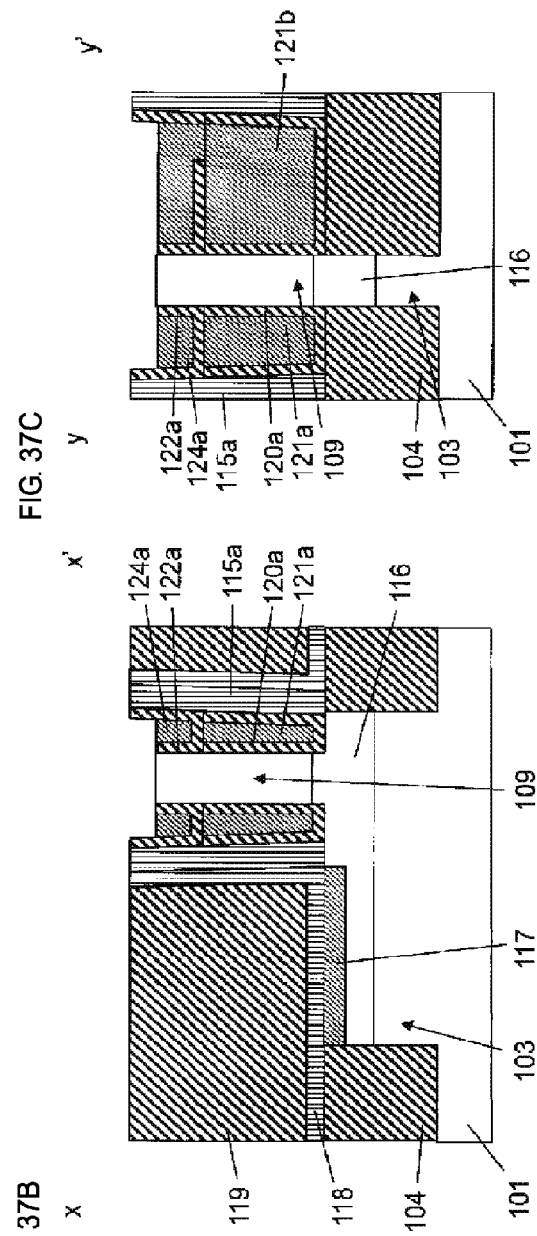
FIG. 37A
FIG. 37B
FIG. 37C

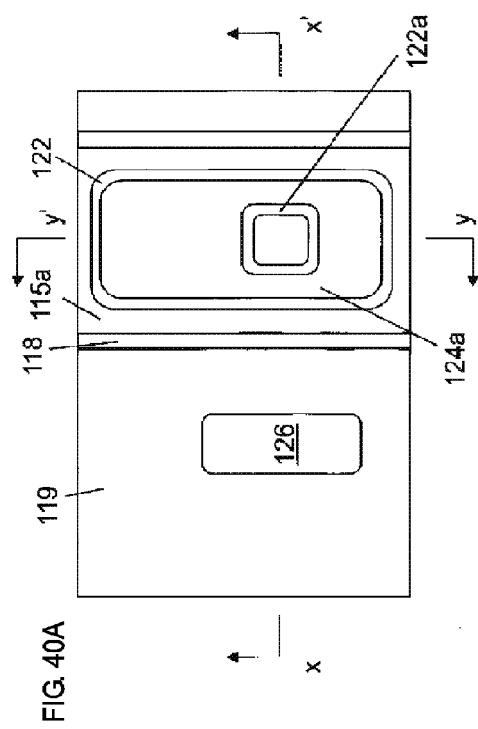
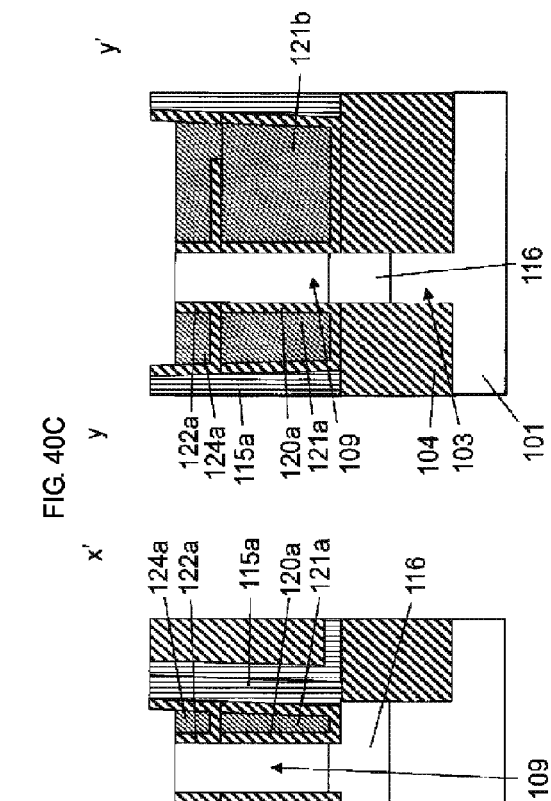
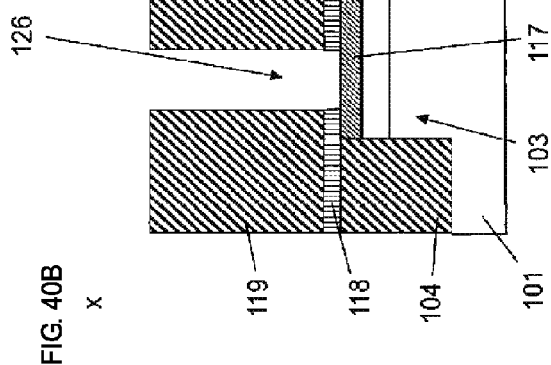

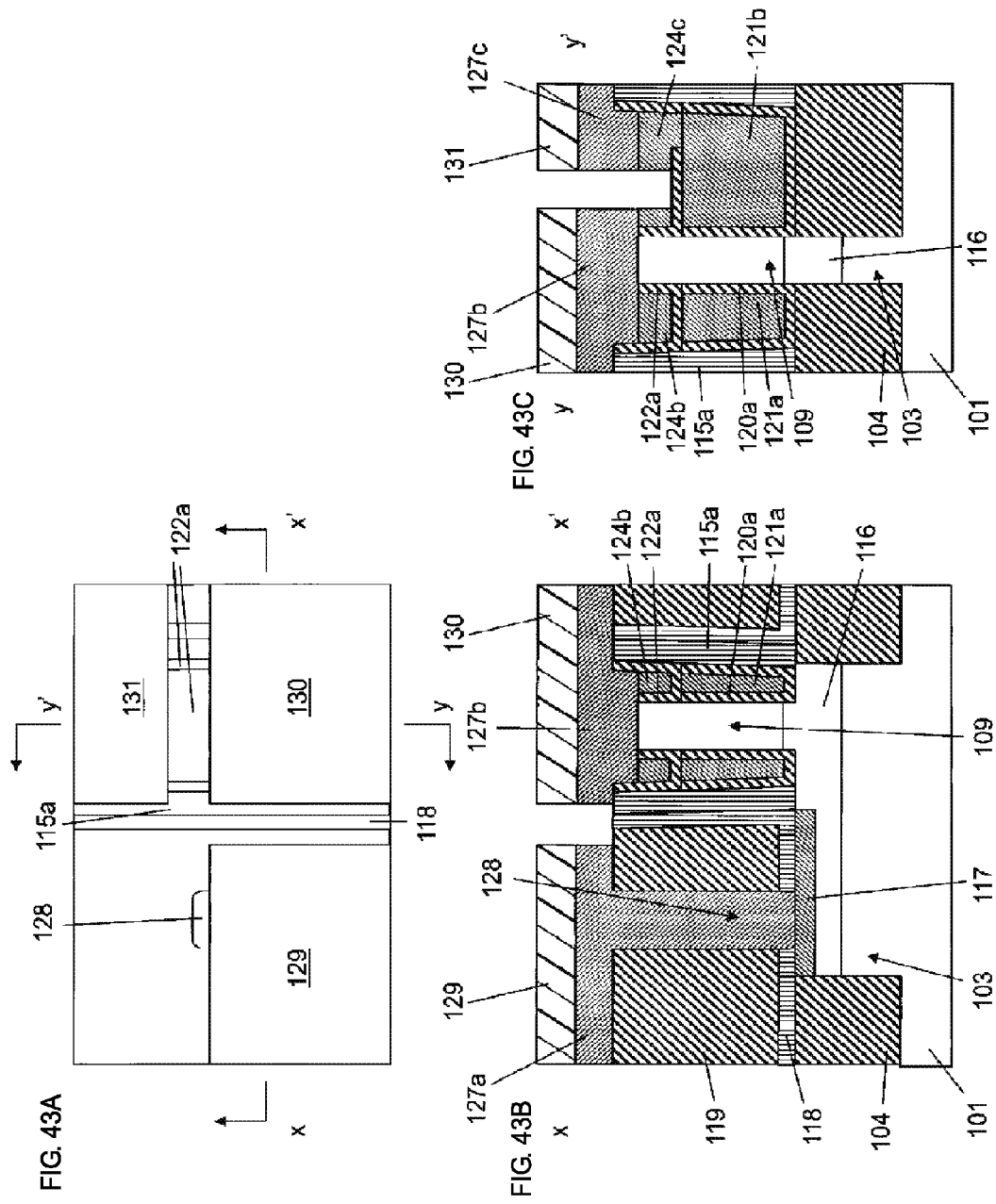

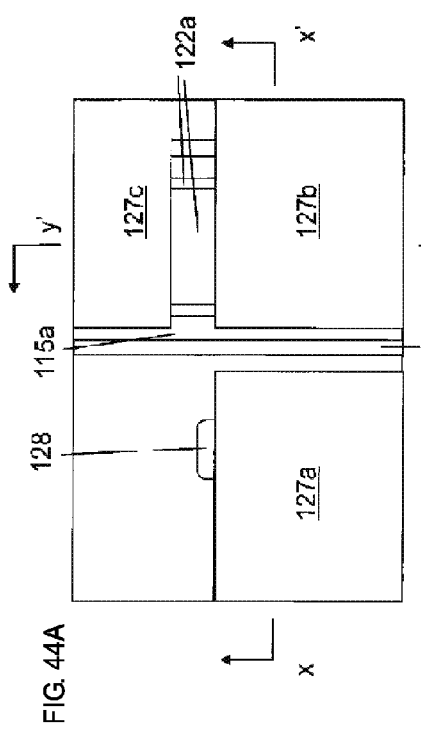
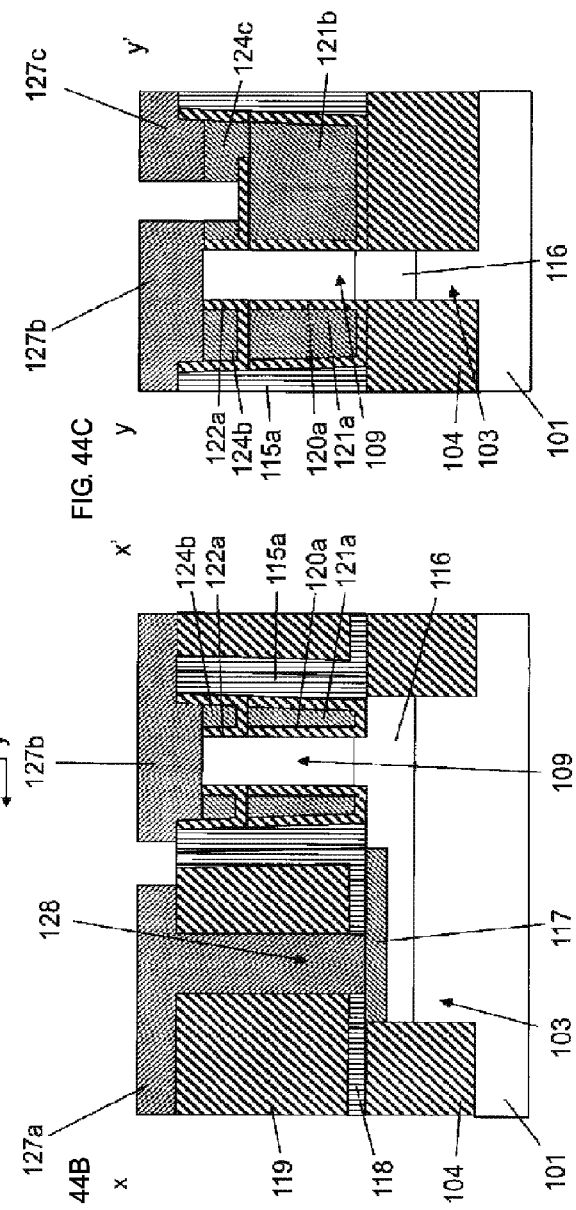
FIG. 44A
FIG. 44B
FIG. 44C

SEMICONDUCTOR DEVICE HAVING FIN-SHAPED SEMICONDUCTOR LAYER

RELATED APPLICATIONS

The present application is divisional application of U.S. patent application Ser. No. 15/143,732, filed May 2, 2016, which is a continuation application of PCT/JP2014/053746, filed Feb. 18, 2014. The entire contents of which are hereby incorporated by reference.

BACKGROUND OF THE INVENTION

Field of the Invention

The present invention relates to a method for producing a semiconductor device and to a semiconductor device.

Description of the Related Art

For semiconductor integrated circuits, in particular, integrated circuits employing MOS transistors, the degree of integration has been continuously increased. With this increase in the degree of integration, the size of MOS transistors in such integrated circuits has been reduced to the order of nanometers. In such small MOS transistors, leak current is difficult to suppress. Thus, from the standpoint of ensuring a sufficiently large current, reduction in the circuit area is difficult to achieve, which has been problematic. In order to address this problem, a Surrounding Gate Transistor (hereafter, referred to as an "SGT") has been proposed, the SGT having a structure in which a source, a gate, and a drain are disposed so as to be perpendicular to a substrate and a gate electrode is disposed so as to surround a pillar-shaped semiconductor layer (for example, refer to Japanese Unexamined Patent Application Publication Nos. 2-71556, 2-188966, and 3-145761).

In existing SGT production methods, a mask for defining a silicon pillar is used to form the silicon pillar including a pillar-shaped nitride-film hard mask; a mask for defining a planar silicon layer is used to form the planar silicon layer under the silicon pillar; and a mask for defining a gate line is used to form the gate line (for example, refer to Japanese Unexamined Patent Application Publication No. 2009-182317).

In other words, three masks are used to form the silicon pillar, the planar silicon layer, and the gate line.

In the production of prior art MOS transistors, in order to successfully perform a metal-gate process and a high-temperature process, a metal-gate last process of performing the high-temperature process and subsequently forming a metal gate is employed (IEDM2007 K. Mistry et. al, pp 247-250). Specifically, a gate is formed of polysilicon; an interlayer insulating film is then deposited; chemical mechanical polishing is then performed to expose the polysilicon gate; the polysilicon gate is etched; and metal is then deposited. Thus, also for SGTs, in order to successfully perform the metal-gate process and the high-temperature process, the metal-gate last process of performing the high-temperature process and subsequently forming the metal gate needs to be employed.

When metal is deposited to fill a hole in which the upper portion is narrower than the lower portion, the upper portion of the hole is first filled with the metal, so that the lower portion is left unfilled.

Prior art MOS transistors employ a first insulating film in order to decrease the parasitic capacitance between the gate line and the substrate. For example, in FINFET (IEDM2010 CC. Wu, et. al, 27.1.1-27.1.4), a first insulating film is formed around a fin-shaped semiconductor layer and the first insulating film is subjected to etch back to expose the fin-shaped semiconductor layer, so that the parasitic capacitance between the gate line and the substrate is decreased. Thus, SGTs also need to employ a first insulating film in order to decrease the parasitic capacitance between the gate line and the substrate. Since SGTs include a fin-shaped semiconductor layer and also a pillar-shaped semiconductor layer, how to form the pillar-shaped semiconductor layer needs to be considered.

When the silicon pillar is narrow, since silicon has a density of $5 \times 10^{22}$ atoms/cm$^3$, it becomes difficult to make impurities be present within the silicon pillar.

For existing SGTs, it has been proposed that the channel concentration is set to a low impurity concentration of $10^{17}$ cm$^{-3}$ or less and the work function of the gate material is changed to adjust the threshold voltage (for example, refer to Japanese Unexamined Patent Application Publication No. 2004-356314).

In a planar MOS transistor, sidewalls on LDD regions are formed of polysilicon of the same conductivity type as that of low-concentration layers, so that surface carriers of the LDD regions are induced by the work-function difference, enabling a decrease in the impedance of the LDD regions, compared with oxide-film-sidewall LDD-type MOS transistors (for example, refer to Japanese Unexamined Patent Application Publication No. 11-297984). This publication discloses that the polysilicon sidewalls are electrically insulated from the gate electrode. The publication also discloses that, in figures, insulation of the polysilicon sidewalls from the source and the drain is achieved with an interlayer insulating film.

SUMMARY OF THE INVENTION

It is accordingly an object of the invention to provide an SGT production method which overcomes the above-mentioned and other disadvantages of the heretofore-known devices and methods of this general type and which provides for an SGT production method that employs a gate last process in which two masks are used to form a fin-shaped semiconductor layer, a pillar-shaped semiconductor layer, a gate electrode, and a gate line; it is a further object to provide the SGT structure obtained by the method.

With the foregoing and other objects in view there is provided, in accordance with the invention, a method for producing a semiconductor device according to an embodiment of the present invention includes a first step of forming a fin-shaped semiconductor layer on a semiconductor substrate and forming a first insulating film around the fin-shaped semiconductor layer; a second step of, after the first step, forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer, so as to be perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed from the first polysilicon, and a first hard mask formed from the third insulating film; a third step of, after the second step, forming a fourth insulating film around the pillar-shaped semiconductor layer and the first dummy gate, depositing a second polysilicon around the fourth insulating film, planarizing the second polysilicon, subjecting the second polysilicon to etch back to expose the first hard mask, depositing a sixth insulating film, etching the sixth insulating film to form a second hard mask on a side wall of the first hard mask, and etching the second polysilicon so as to be left on a side wall of the first dummy gate and a side wall of the pillar-shaped semiconductor layer to form a second dummy gate; a fourth step of, after the third step, forming a sidewall by processing a fifth insulating film so as to have a sidewall shape around the second dummy gate, forming a second diffusion layer in an upper portion of the fin-shaped semiconductor layer and a lower portion of the pillar-shaped semiconductor layer, and forming a metal-semiconductor compound on the second diffusion layer; a fifth step of, after the fourth step, depositing an interlayer insulating film, exposing an upper portion of the second dummy gate and an upper portion of the first dummy gate, removing the second dummy gate and the first dummy gate, forming a first gate insulating film around the pillar-shaped semiconductor layer and on an inner side of the fifth insulating film, depositing a first metal, and forming a gate electrode and a gate line; and a sixth step of, after the fifth step, depositing a second gate insulating film around the pillar-shaped semiconductor layer and on the gate electrode and the gate line, removing a portion of the second gate insulating film on the gate line, depositing a second metal, subjecting the second metal to etch back, removing the second gate insulating film on the pillar-shaped semiconductor layer, depositing a third metal, and etching a portion of the third metal and a portion of the second metal to form a first contact formed of the second metal surrounding an upper side wall of the pillar-shaped semiconductor layer such that an upper portion of the first contact is connected to an upper portion of the pillar-shaped semiconductor layer and to form a second contact formed of the second metal on the gate line.

The second dummy gate may have a top surface and a bottom surface, the top surface having a larger area than the bottom surface.

The second step may be a step in which the second insulating film is formed around the fin-shaped semiconductor layer, the first polysilicon is deposited on the second insulating film and planarized, the second resist for forming the gate line and the pillar-shaped semiconductor layer is formed so as to be perpendicular to the direction in which the fin-shaped semiconductor layer extends, and the first polysilicon, the second insulating film, and the fin-shaped semiconductor layer are etched to form the pillar-shaped semiconductor layer and the first dummy gate formed of the first polysilicon.

The fourth step may be a step in which the fifth insulating film is formed around the second dummy gate and etched so as to have a sidewall shape to form the sidewall from the fifth insulating film, the second diffusion layer is formed in the upper portion of the fin-shaped semiconductor layer and the lower portion of the pillar-shaped semiconductor layer, and the metal-semiconductor compound is formed on the second diffusion layer.

The fifth step may be a step in which the interlayer insulating film is deposited and subjected to chemical mechanical polishing to expose the upper portion of the second dummy gate and the upper portion of the first dummy gate, the second dummy gate and the first dummy gate are removed, the second insulating film and the fourth insulating film are removed, the first gate insulating film is formed around the pillar-shaped semiconductor layer and on the inner side of the fifth insulating film, and the first metal is deposited and subjected to etch back to form the gate electrode and the gate line.

The method may further include a substep of, after the fourth step, depositing a contact stopper film.

The method may further include a substep of, after the fifth step, removing the first gate insulating film.

The metal of the first contact may have a work function of 4.0 eV to 4.2 eV.

The metal of the first contact may have a work function of 5.0 eV to 5.2 eV.

A semiconductor device according to an embodiment of the present invention includes a fin-shaped semiconductor layer formed on a semiconductor substrate; a first insulating film formed around the fin-shaped semiconductor layer; a pillar-shaped semiconductor layer formed on the fin-shaped semiconductor layer; a first gate insulating film formed around the pillar-shaped semiconductor layer; a gate electrode formed of metal and formed around the first gate insulating film; a gate line connected to the gate electrode, extending in a direction orthogonal to the fin-shaped semiconductor layer, and formed of metal; the first gate insulating film formed around and under the gate electrode and the gate line; a second diffusion layer formed in an upper portion of the fin-shaped semiconductor layer and in a lower portion of the pillar-shaped semiconductor layer; a second gate insulating film formed around an upper side wall of the pillar-shaped semiconductor layer; and a first contact formed around the second gate insulating film and formed of a second metal, wherein the gate electrode has a top surface and a bottom surface, the top surface having a larger area than the bottom surface, the gate line has a top surface and a bottom surface, the top surface having a larger area than the bottom surface, and an upper portion of the first contact is connected to an upper portion of the pillar-shaped semiconductor layer.

The semiconductor device may further include a second contact formed of the second metal on the gate line.

The second metal of the first contact may have a work function of 4.0 eV to 4.2 eV.

The second metal of the first contact may have a work function of 5.0 eV to 5.2 eV.

The present invention can provide an SGT production method employing a gate last process in which two masks are used to form a fin-shaped silicon layer, a pillar-shaped silicon layer, a gate electrode, and a gate line, and can provide the SGT structure obtained by the method.

A method for producing a semiconductor device according to an embodiment includes a first step of forming a fin-shaped semiconductor layer on a semiconductor substrate and forming a first insulating film around the fin-shaped semiconductor layer; a second step of, after the first step, forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer, so as to be perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed from the first polysilicon, and a first hard mask formed from the third insulating film; and a third step of, after the second step, forming a fourth insulating film around the pillar-shaped semiconductor layer and the first dummy gate, depositing a second polysilicon around the fourth insulating film, planarizing the second polysilicon, subjecting the second polysilicon to etch back to expose the first hard mask, depositing a sixth insulating film, etching the sixth insulating film to form a second hard mask on a side wall of the first hard mask, and etching the second polysilicon so as to be left on a side wall of the first dummy gate and a side wall of the pillar-shaped semiconductor layer to form a second dummy gate. As a result, use of the two masks enables formation of the fin-shaped semiconductor layer, the pillar-shaped semiconductor layer, and the first dummy gate and the second dummy gate that are to provide a gate electrode and a gate line. Thus, reduction in the number of steps can be achieved.

The first and second hard masks prevent the metal-semiconductor compound from being formed on the first and second dummy gates, so that the metal-semiconductor compound can be formed on the fin-shaped semiconductor layer alone.

The second polysilicon may be etched so as to have an inversely tapering shape, so that the second dummy gate has a top surface and a bottom surface, the top surface having a larger area than the bottom surface. As a result, when metal is deposited to fill the hole for forming a gate, the hole is prevented from being partially unfilled.

Misalignment between the pillar-shaped semiconductor layer and the gate line can be prevented.

An existing metal-gate last process can be employed in which a first dummy gate and a second dummy gate are formed from polysilicon; an interlayer insulating film is then deposited; chemical mechanical polishing is then performed to expose the first dummy gate and the second dummy gate; the polysilicon gates are etched; and metal is then deposited. Thus, metal-gate SGTs can be easily formed.

When the metal-gate last process is simply applied to SGTs, the upper portion of a pillar-shaped semiconductor layer is covered with a polysilicon gate, so that a diffusion layer becomes difficult to form in the upper portion of the pillar-shaped semiconductor layer. For this reason, prior to formation of the polysilicon gate, the diffusion layer is formed in the upper portion of the pillar-shaped semiconductor layer. In contrast, in the present invention, the diffusion layer in the upper portion of the pillar-shaped semiconductor layer is not formed, but the upper portion of the pillar-shaped semiconductor layer serves as an n-type semiconductor layer or a p-type semiconductor layer due to a work-function difference between metal and semiconductor. Thus, the step of forming the diffusion layer in the upper portion of the pillar-shaped semiconductor layer can be eliminated.

The first gate insulating film formed around and under the gate electrode and the gate line enables insulation of the gate electrode and the gate line from the pillar-shaped semiconductor layer and the fin-shaped semiconductor layer.

BRIEF DESCRIPTION OF THE DRAWINGS

FIG. 1A is a plan view of a semiconductor device according to an embodiment of the present invention; FIG. 1B is a sectional view taken along line X-X' in FIG. 1A; and FIG. 1C is a sectional view taken along line Y-Y' in FIG. 1A.

FIG. 2A is a plan view for explaining a method for producing a semiconductor device according to an embodiment of the present invention; FIG. 2B is a sectional view taken along line X-X' in FIG. 2A; and FIG. 2C is a sectional view taken along line Y-Y' in FIG. 2A.

FIG. 3A is a plan view for explaining a method for producing a semiconductor device according to an embodiment of the present invention; FIG. 3B is a sectional view taken along line X-X in FIG. 3A; and FIG. 3C is a sectional view taken along line Y-Y' in FIG. 3A.

FIG. 5A is a plan view for explaining a method for producing a semiconductor device according to an embodiment of the present invention; FIG. 5B is a sectional view taken along line X-X' in FIG. 5A; and FIG. 5C is a sectional view taken along line Y-Y' in FIG. 5A.

FIG. 7A is a plan view for explaining a method for producing a semiconductor device according to an embodiment of the present invention; FIG. 7B is a sectional view taken along line X-X' in FIG. 7A; and FIG. 7C is a sectional view taken along line Y-Y' in FIG. 7A.

FIG. 12A is a plan view for explaining a method for producing a semiconductor device according to an embodiment of the present invention; FIG. 12B is a sectional view taken along line X-X' in FIG. 12A; and FIG. 12C is a sectional view taken along line Y-Y' in FIG. 12A.

FIG. 15A is a plan view for explaining a method for producing a semiconductor device according to an embodiment of the present invention; FIG. 15B is a sectional view taken along line X-X' in FIG. 15A; and FIG. 15C is a sectional view taken along line Y-Y' in FIG. 15A.

FIG. 16A is a plan view for explaining a method for producing a semiconductor device according to an embodiment of the present invention; FIG. 16B is a sectional view taken along line X-X' in FIG. 16A; and FIG. 16C is a sectional view taken along line Y-Y' in FIG. 16A.

FIG. 17A is a plan view for explaining a method for producing a semiconductor device according to an embodiment of the present invention; FIG. 17B is a sectional view taken along line X-X' in FIG. 17A; and FIG. 17C is a sectional view taken along line Y-Y' in FIG. 17A.

FIG. 19A is a plan view for explaining a method for producing a semiconductor device according to an embodiment of the present invention; FIG. 19B is a sectional view taken along line X-X' in FIG. 19A; and FIG. 19C is a sectional view taken along line Y-Y' in FIG. 19A.

FIG. 20A is a plan view for explaining a method for producing a semiconductor device according to an embodiment of the present invention; FIG. 20B is a sectional view taken along line X-X' in FIG. 20A; and FIG. 20C is a sectional view taken along line Y-Y' in FIG. 20A.

FIG. 21A is a plan view for explaining a method for producing a semiconductor device according to an embodiment of the present invention; FIG. 21B is a sectional view taken along line X-X' in FIG. 21A; and FIG. 21C is a sectional view taken along line Y-Y' in FIG. 21A.

FIG. 22A is a plan view for explaining a method for producing a semiconductor device according to an embodiment of the present invention; FIG. 22B is a sectional view taken along line X-X' in FIG. 22A; and FIG. 22C is a sectional view taken along line Y-Y' in FIG. 22A.

FIG. 24A is a plan view for explaining a method for producing a semiconductor device according to an embodiment of the present invention; FIG. 24B is a sectional view taken along line X-X' in FIG. 24A; and FIG. 24C is a sectional view taken along line Y-Y' in FIG. 24A.

FIG. 25A is a plan view for explaining a method for producing a semiconductor device according to an embodiment of the present invention; FIG. 25B is a sectional view taken along line X-X' in FIG. 25A; and FIG. 25C is a sectional view taken along line Y-Y' in FIG. 25A.

FIG. 28A is a plan view for explaining a method for producing a semiconductor device according to an embodiment of the present invention; FIG. 28B is a sectional view taken along line X-X' in FIG. 28A; and FIG. 28C is a sectional view taken along line Y-Y' in FIG. 28A.

FIG. 29A is a plan view for explaining a method for producing a semiconductor device according to an embodiment of the present invention; FIG. 29B is a sectional view taken along line X-X' in FIG. 29A; and FIG. 29C is a sectional view taken along line Y-Y' in FIG. 29A.

FIG. 34A is a plan view for explaining a method for producing a semiconductor device according to an embodiment of the present invention; FIG. 34B is a sectional view taken along line X-X in FIG. 34A; and FIG. 34C is a sectional view taken along line Y-Y' in FIG. 34A.

FIG. 37A is a plan view for explaining a method for producing a semiconductor device according to an embodiment of the present invention; FIG. 37B is a sectional view taken along line X-X' in FIG. 37A; and FIG. 37C is a sectional view taken along line Y-Y' in FIG. 37A.

FIG. 40A is a plan view for explaining a method for producing a semiconductor device according to an embodiment of the present invention; FIG. 40B is a sectional view taken along line X-X' in FIG. 40A; and FIG. 40C is a sectional view taken along line Y-Y' in FIG. 40A.

FIG. 43A is a plan view for explaining a method for producing a semiconductor device according to an embodiment of the present invention; FIG. 43B is a sectional view taken along line X-X' in FIG. 43A; and FIG. 43C is a sectional view taken along line Y-Y' in FIG. 43A.

FIG. 44A is a plan view for explaining a method for producing a semiconductor device according to an embodiment of the present invention; FIG. 44B is a sectional view taken along line X-X' in FIG. 44A; and FIG. 44C is a sectional view taken along line Y-Y' in FIG. 44A.

DETAILED DESCRIPTION OF THE PREFERRED EMBODIMENTS

Hereinafter, production steps for forming an SGT structure according to an embodiment of the present invention will be described with reference to FIGS. 2A to 44C.

A first step will be described, the first step including forming a fin-shaped semiconductor layer on a semiconductor substrate and forming a first insulating film around the fin-shaped semiconductor layer. In this embodiment, the semiconductor substrate is formed of silicon; alternatively, the semiconductor substrate may be formed of a semiconductor other than silicon.

As illustrated in FIGS. 2A to 2C, a first resist 102 for forming a fin-shaped silicon layer is formed on a silicon substrate 101.

As illustrated in FIGS. 3A to 3C, the silicon substrate 101 is etched to form a fin-shaped silicon layer 103. In this embodiment, the resist is used as a mask to form the fin-shaped silicon layer; alternatively, a hard mask of an oxide film or a nitride film may be used.

Figure 4A:
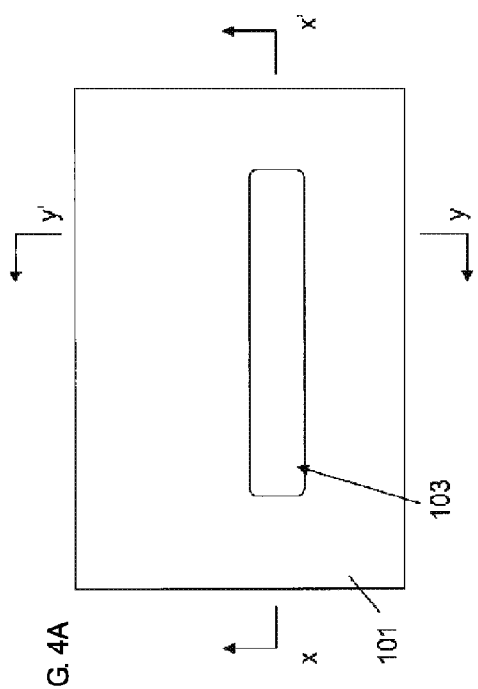
FIG. 4A is a plan view for explaining a method for producing a semiconductor device according to an embodiment of the present invention.
Figure 4C:
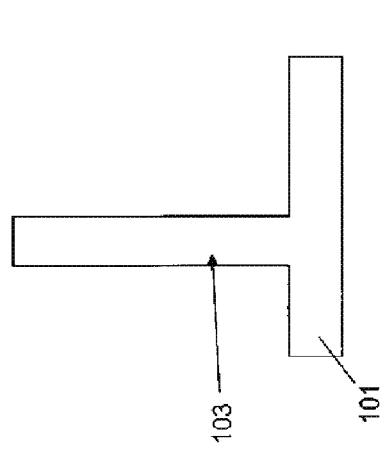
FIG. 4C is a sectional view taken along line Y-Y' in FIG. 4A.
Figure 4B:
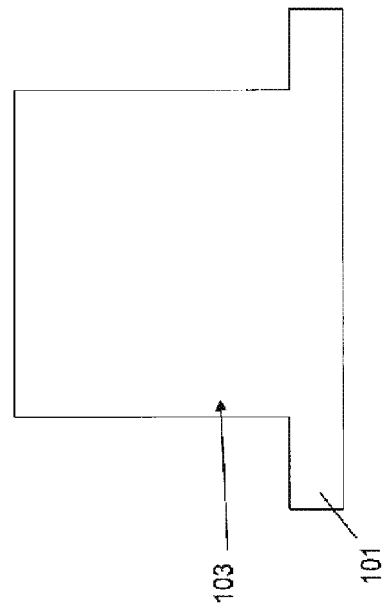
FIG. 4B is a sectional view taken along line X-X' in FIG. 4A.

As illustrated in FIGS. 4A to 4C, the first resist 102 is removed.

As illustrated in FIGS. 5A to 5C, a first insulating film 104 is deposited around the fin-shaped silicon layer 103. The first insulating film may be an oxide film formed with high-density plasma or an oxide film formed by low-pressure CVD (Chemical Vapor Deposition).

Figure 6A:
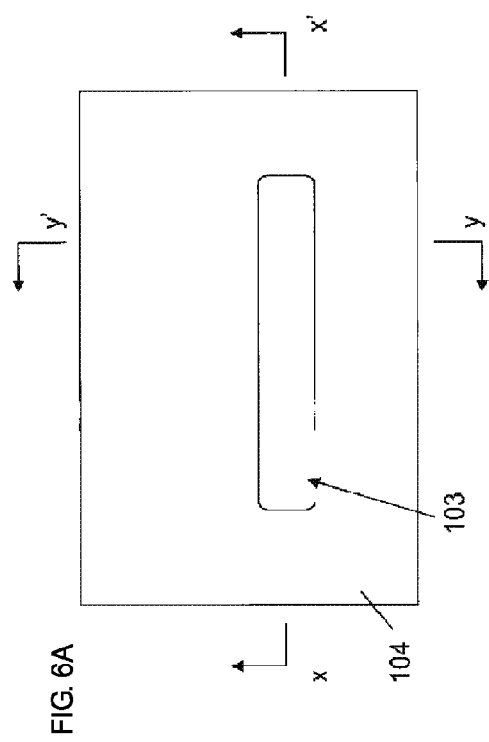
FIG. 6A is a plan view for explaining a method for producing a semiconductor device according to an embodiment of the present invention.
Figure 6C:
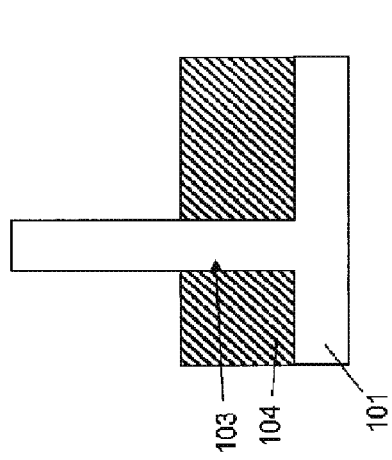
FIG. 6C is a sectional view taken along line Y-Y' in FIG. 6A.
Figure 6B:
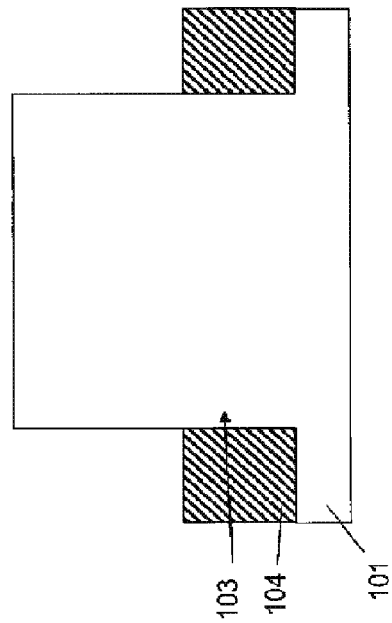
FIG. 6B is a sectional view taken along line X-X' in FIG. 6A.

As illustrated in FIGS. 6A to 6C, the first insulating film 104 is subjected to etch back to expose an upper portion of the fin-shaped silicon layer 103. These processes having been described so far are the same as in the method for forming a fin-shaped silicon layer in IEDM2010 CC. Wu, et al., 27.1.1-27.1.4.

Thus, the first step has been described, the first step including forming a fin-shaped semiconductor layer on a semiconductor substrate and forming a first insulating film around the fin-shaped semiconductor layer.

Hereafter, a second step will be described, the second step including forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer, so as to be perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed from the first polysilicon, and a first hard mask formed from the third insulating film.

As illustrated in FIGS. 7A to 7C, a second insulating film 105 is formed around the fin-shaped silicon layer 103. The second insulating film 105 is preferably an oxide film.

Figure 8A:
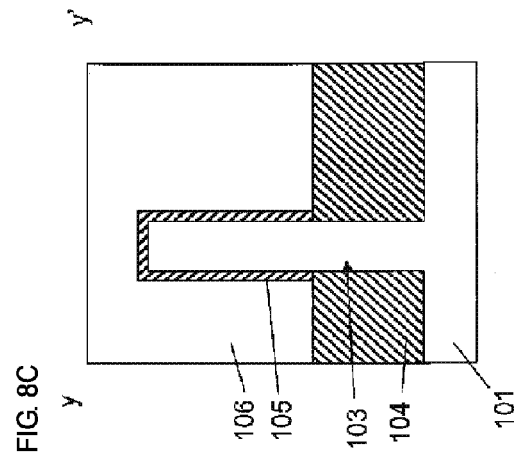
FIG. 8A is a plan view for explaining a method for producing a semiconductor device according to an embodiment of the present invention.
Figure 8B:
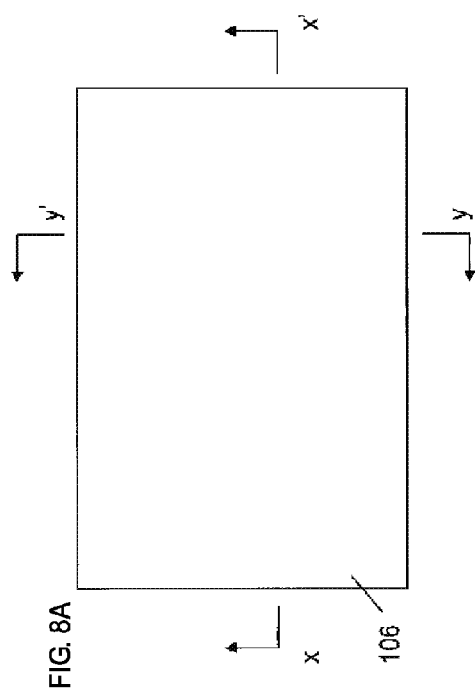
FIG. 8B is a sectional view taken along line X-X' in FIG. 8A.
Figure 8C:
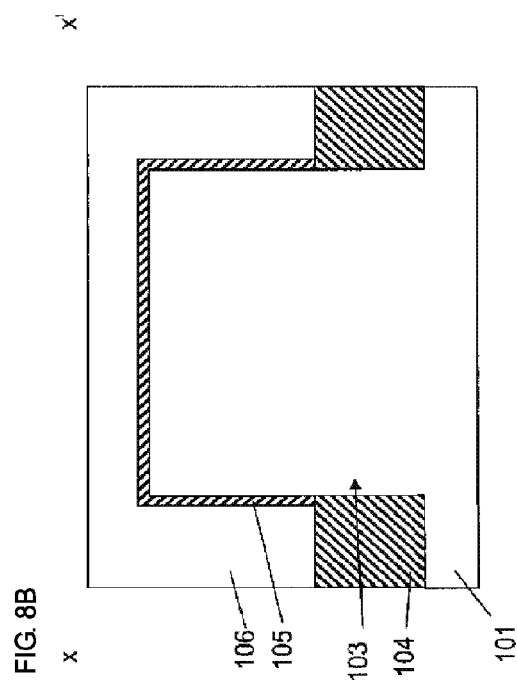
FIG. 8C is a sectional view taken along line Y-Y' in FIG. 8A.

As illustrated in FIGS. 8A to 8C, a first polysilicon 106 is deposited on the second insulating film 105 and planarized.

Figure 9A:
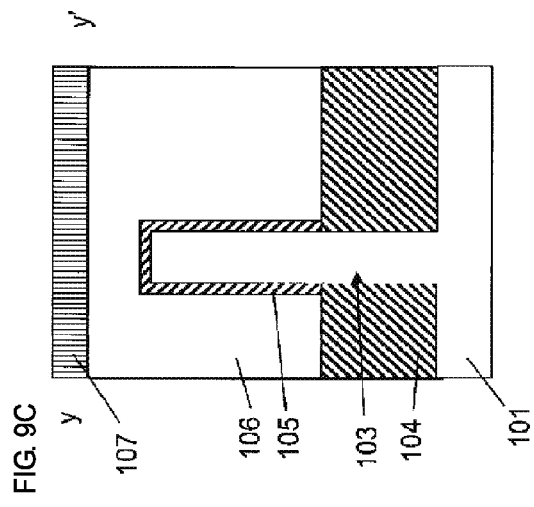
FIG. 9A is a plan view for explaining a method for producing a semiconductor device according to an embodiment of the present invention.
Figure 9B:
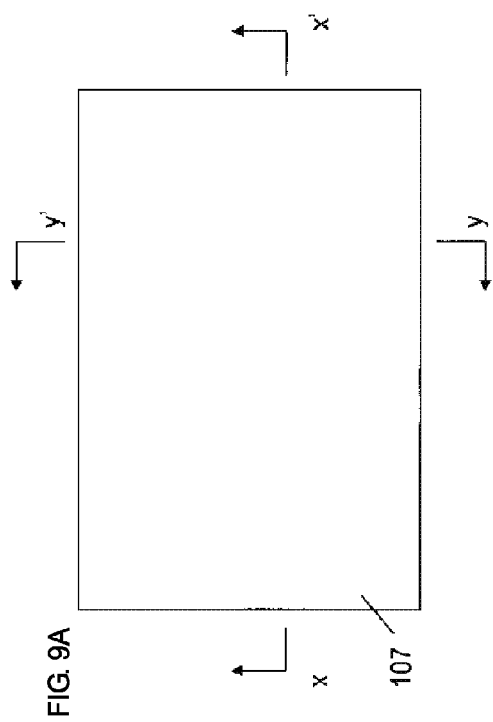
FIG. 9B is a sectional view taken along line X-X' in FIG. 9A.
Figure 9C:
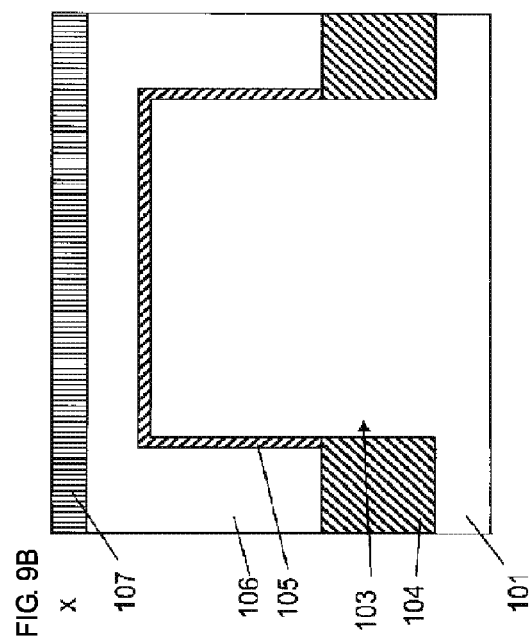
FIG. 9C is a sectional view taken along line Y-Y' in FIG. 9A.

As illustrated in FIGS. 9A to 9C, a third insulating film 107 is formed on the first polysilicon 106. The third insulating film 107 is preferably a nitride film.

Figure 10A:
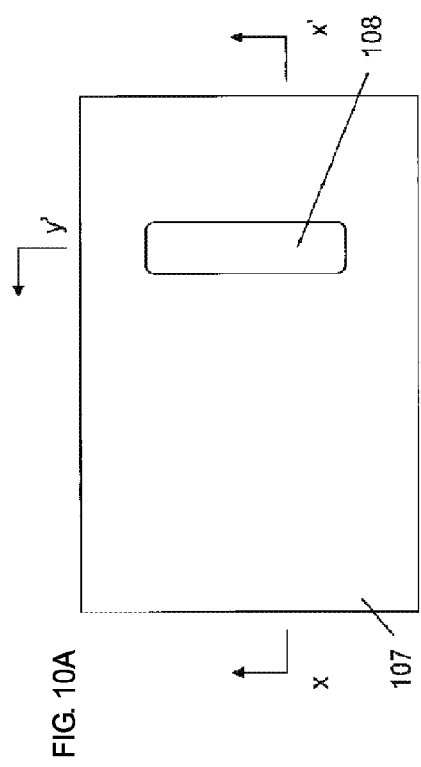
FIG. 10A is a plan view for explaining a method for producing a semiconductor device according to an embodiment of the present invention.
Figure 10C:
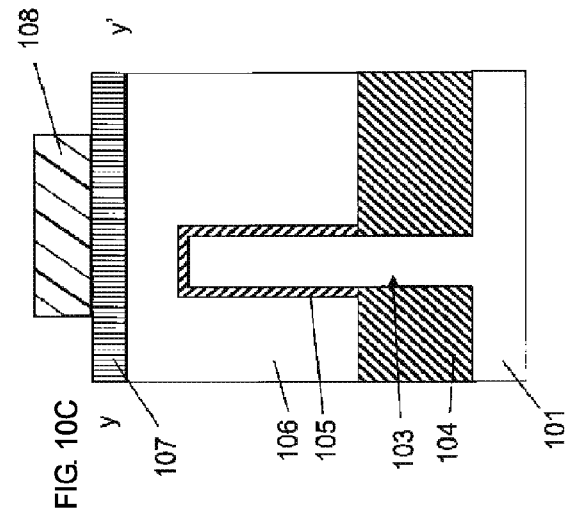
FIG. 10C is a sectional view taken along line Y-Y' in FIG. 10A.
Figure 10B:
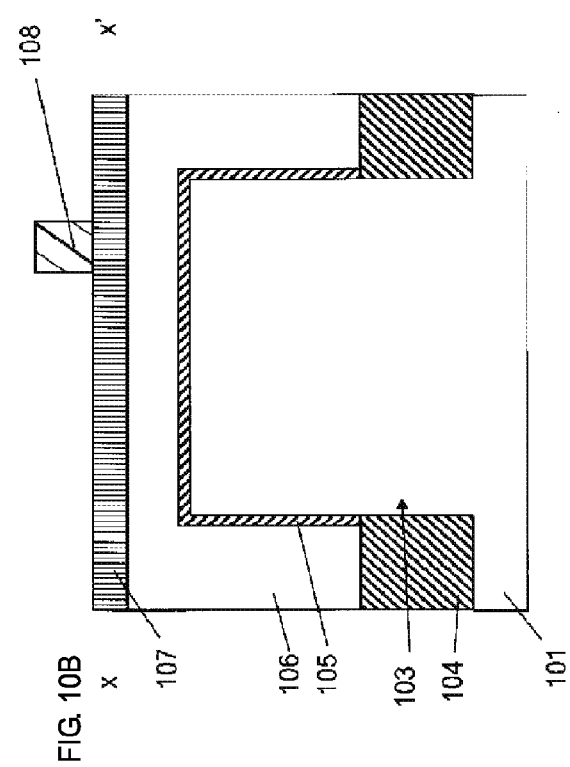
FIG. 10B is a sectional view taken along line X-X' in FIG. 10A.

As illustrated in FIGS. 10A to 10C, a second resist 108 for forming a gate line and a pillar-shaped silicon layer is formed so as to be perpendicular to the direction in which the fin-shaped silicon layer 103 extends.

Figure 11A:
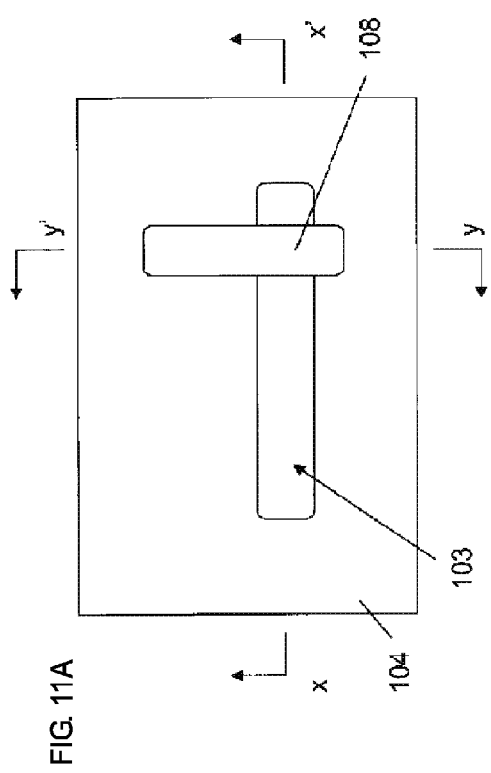
FIG. 11A is a plan view for explaining a method for producing a semiconductor device according to an embodiment of the present invention.
Figure 11C:
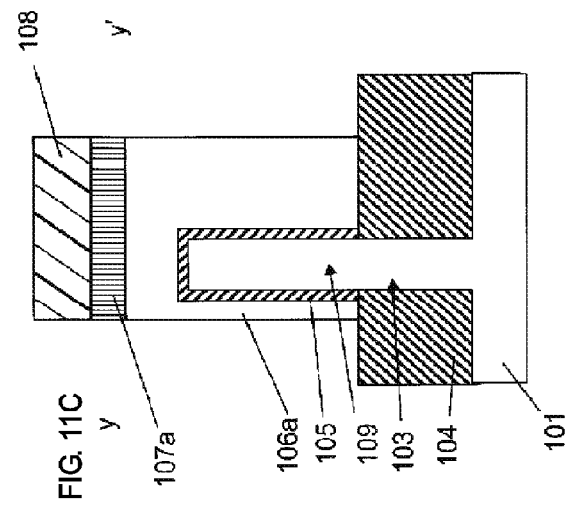
FIG. 11C is a sectional view taken along line Y-Y' in FIG. 11A.
Figure 11B:
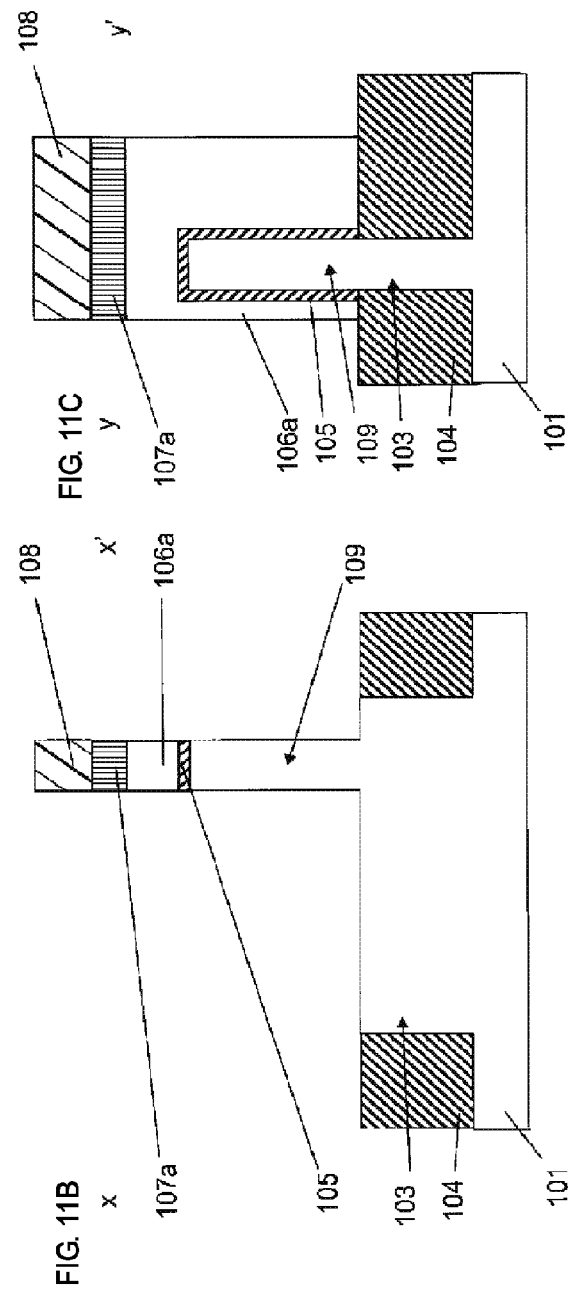
FIG. 11B is a sectional view taken along line X-X' in FIG. 11A.

As illustrated in FIGS. 11A to 11C, the third insulating film 107, the first polysilicon 106, the second insulating film 105, and the fin-shaped silicon layer 103 are etched to form a pillar-shaped silicon layer 109, a first dummy gate 106a formed from the first polysilicon, and a first hard mask 107a formed from the third insulating film.

As illustrated in FIGS. 12A to 12C, the second resist 108 is removed.

Thus, the second step has been described, the second step including forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer, so as to be perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed from the first polysilicon, and a first hard mask formed from the third insulating film.

Hereafter, a third step will be described, the third step including, after the second step, forming a fourth insulating film around the pillar-shaped semiconductor layer and the first dummy gate, depositing a second polysilicon around the fourth insulating film, planarizing the second polysilicon, subjecting the second polysilicon to etch back to expose the first hard mask, depositing a sixth insulating film, etching the sixth insulating film to form a second hard mask on a side wall of the first hard mask, and etching the second polysilicon so as to be left on a side wall of the first dummy gate and a side wall of the pillar-shaped semiconductor layer to form a second dummy gate.

Figure 13A:
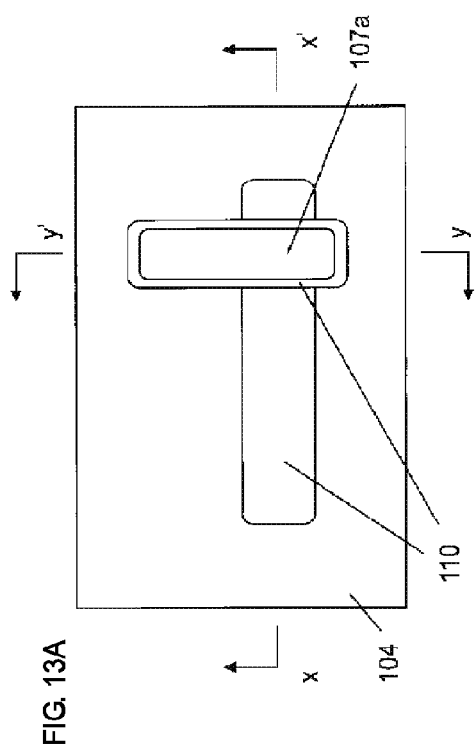
FIG. 13A is a plan view for explaining a method for producing a semiconductor device according to an embodiment of the present invention.
Figure 13C:
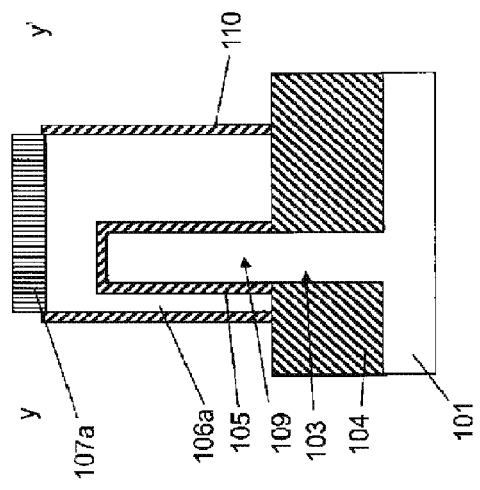
FIG. 13C is a sectional view taken along line Y-Y' in FIG. 13A.
Figure 13B:
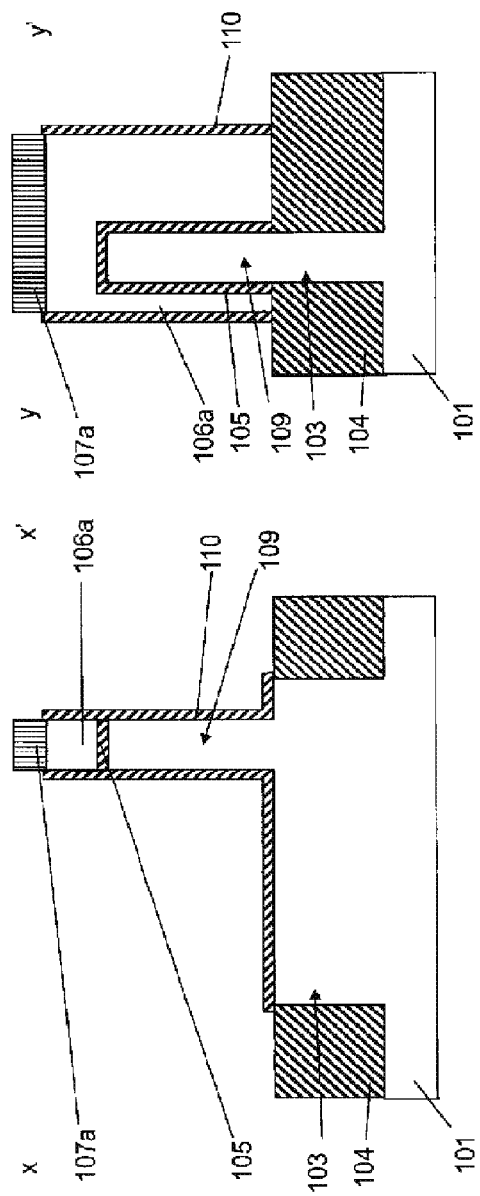
FIG. 13B is a sectional view taken along line X-X' in FIG. 13A.

As illustrated in FIGS. 13A to 13C, a fourth insulating film 110 is formed around the pillar-shaped silicon layer 109 and the first dummy gate 106a. The fourth insulating film 110 is preferably an oxide film.

Figure 14A:
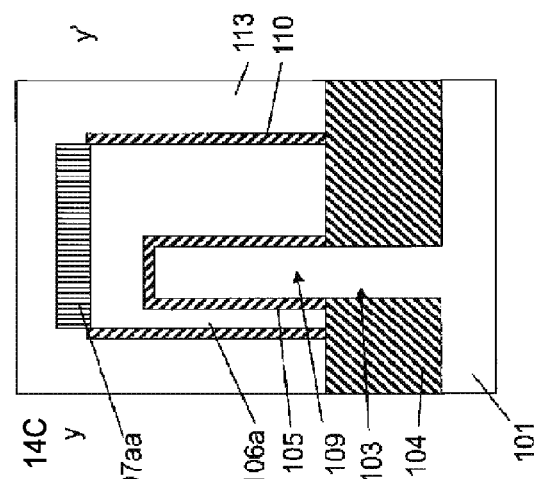
FIG. 14A is a plan view for explaining a method for producing a semiconductor device according to an embodiment of the present invention.
Figure 14B:
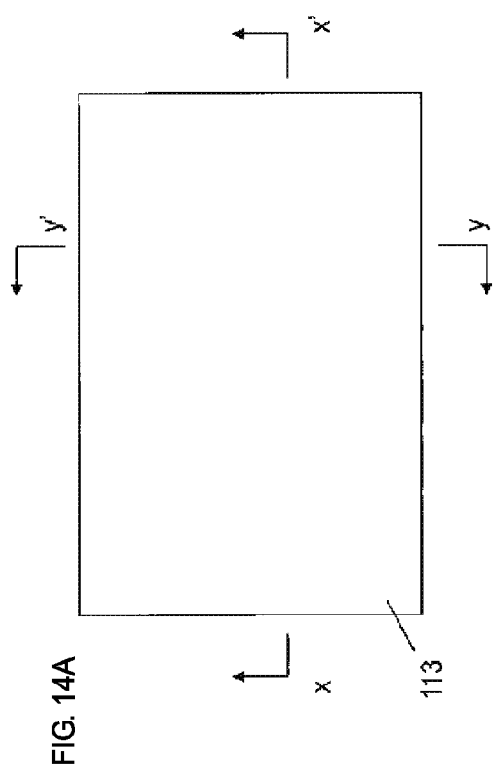
FIG. 14B is a sectional view taken along line X-X' in FIG. 14A.
Figure 14C:
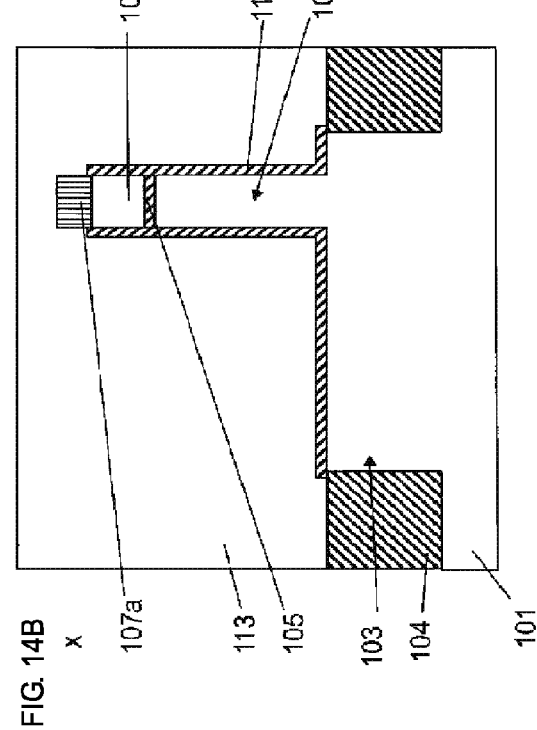
FIG. 14C is a sectional view taken along line Y-Y' in FIG. 14A.

As illustrated in FIGS. 14A to 14C, a second polysilicon 113 is deposited around the fourth insulating film 110 and planarized.

As illustrated in FIGS. 15A to 15C, the second polysilicon 113 is subjected to etch back to expose the first hard mask 107a.

As illustrated in FIGS. 16A to 16C, a sixth insulating film 114 is deposited. The sixth insulating film 114 is preferably a nitride film.

As illustrated in FIGS. 17A to 17C, the sixth insulating film 114 is etched to form a second hard mask 114a on the side wall of the first hard mask 107a.

Figure 18A:
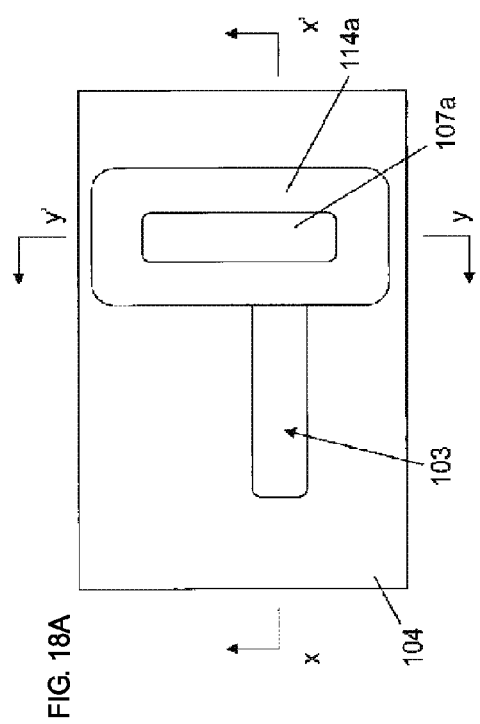
FIG. 18A is a plan view for explaining a method for producing a semiconductor device according to an embodiment of the present invention.
Figure 18C:
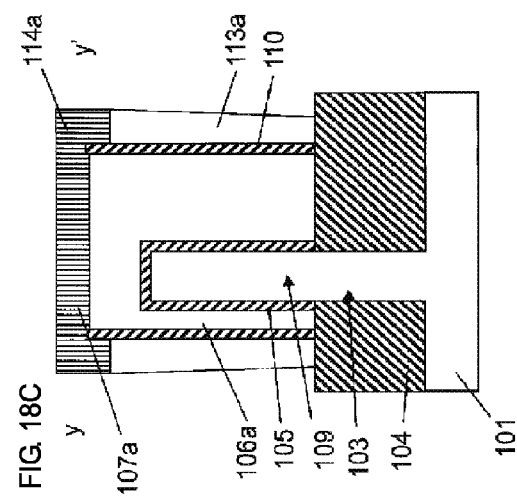
FIG. 18C is a sectional view taken along line Y-Y' in FIG. 18A.
Figure 18B:
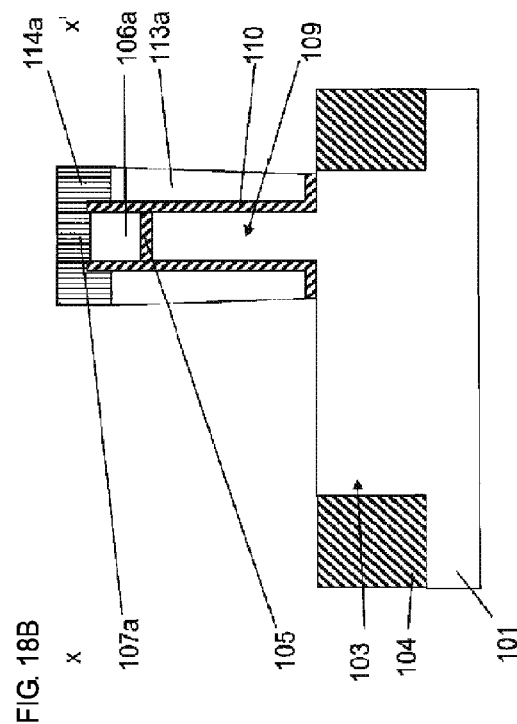
FIG. 18B is a sectional view taken along line X-X' in FIG. 18A.

As illustrated in FIGS. 18A to 18C, the second polysilicon 113 is etched so as to be left on the side wall of the first dummy gate 106a and on the side wall of the pillar-shaped semiconductor layer 109 to thereby form a second dummy gate 113a. The second polysilicon 113 is etched so as to have an inversely tapering shape, so that the second dummy gate 113a has a top surface and a bottom surface, the top surface having a larger area than the bottom surface. As a result, when metal is deposited to fill the hole for forming a gate, the hole is prevented from being partially unfilled.

Thus, the third step has been described, the third step including, after the second step, forming a fourth insulating film around the pillar-shaped semiconductor layer and the first dummy gate, depositing a second polysilicon around the fourth insulating film, planarizing the second polysilicon, subjecting the second polysilicon to etch back to expose the first hard mask, depositing a sixth insulating film, etching the sixth insulating film to form a second hard mask on a side wall of the first hard mask, and etching the second polysilicon so as to be left on a side wall of the first dummy gate and a side wall of the pillar-shaped semiconductor layer to form a second dummy gate.

Hereafter, a fourth step will be described, the fourth step including, after the third step, forming a sidewall by processing a fifth insulating film so as to have a sidewall shape around the second dummy gate, forming a second diffusion layer in an upper portion of the fin-shaped semiconductor layer and a lower portion of the pillar-shaped semiconductor layer, and forming a metal-semiconductor compound on the second diffusion layer.

As illustrated in FIGS. 19A to 19C, a fifth insulating film 115 is formed around the second dummy gate 113a. The fifth insulating film 115 is preferably a nitride film.

As illustrated in FIGS. 20A to 20C, the fifth insulating film 115 is etched so as to have a sidewall shape. Thus, a sidewall 115a is formed from the fifth insulating film.

As illustrated in FIGS. 21A to 21C, an impurity is introduced to form a second diffusion layer 116 in an upper portion of the fin-shaped silicon layer 103 and in a lower portion of the pillar-shaped silicon layer 109. When an n-type diffusion layer is formed, arsenic or phosphorus is preferably introduced. When a p-type diffusion layer is formed, boron is preferably introduced. The impurity may be introduced prior to formation of the fifth insulating film.

As illustrated in FIGS. 22A to 22C, a metal-semiconductor compound 117 is formed on the second diffusion layer 116. During this formation, the first and second hard masks 107a and 114a prevent the metal-semiconductor compound from being formed on the first and second dummy gates 106a and 113a, so that the metal-semiconductor compound is formed on the fin-shaped semiconductor layer 103 alone.

Thus, the fourth step has been described, the fourth step including, after the third step, forming a sidewall by processing a fifth insulating film so as to have a sidewall shape around the second dummy gate, fainting a second diffusion layer in an upper portion of the fin-shaped semiconductor layer and a lower portion of the pillar-shaped semiconductor layer, and forming a metal-semiconductor compound on the second diffusion layer.

Hereafter, a fifth step will be described, the fifth step including, after the fourth step, depositing an interlayer insulating film, exposing an upper portion of the second dummy gate and an upper portion of the first dummy gate, removing the second dummy gate and the first dummy gate, forming a first gate insulating film around the pillar-shaped semiconductor layer and on an inner side of the fifth insulating film, depositing a first metal, and forming a gate electrode and a gate line.

Figure 23A:
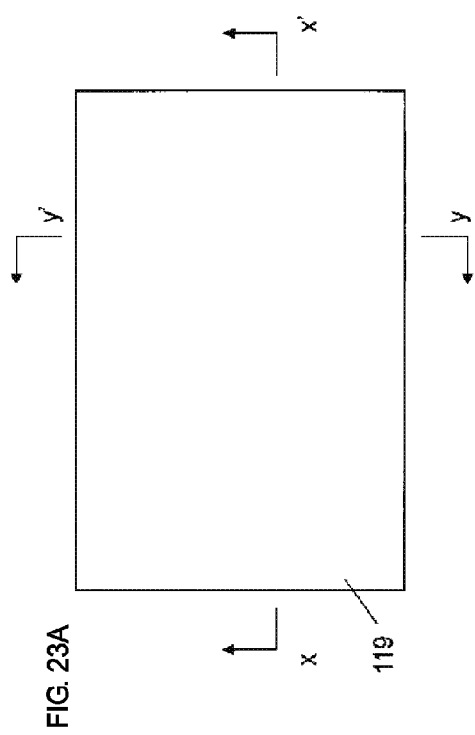
FIG. 23A is a plan view for explaining a method for producing a semiconductor device according to an embodiment of the present invention.
Figure 23C:
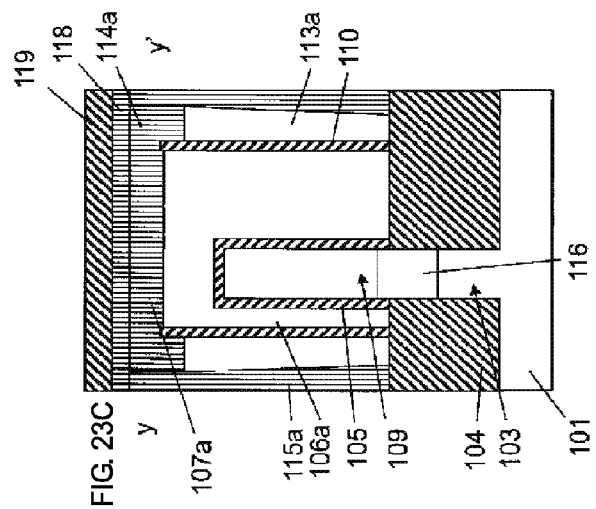
FIG. 23C is a sectional view taken along line Y-Y' in FIG. 23A.
Figure 23B:
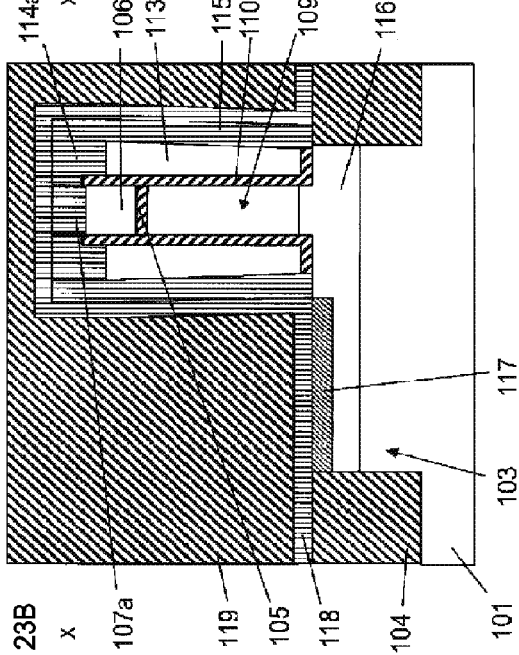
FIG. 23B is a sectional view taken along line X-X in FIG. 23A.

As illustrated in FIGS. 23A to 23C, a contact stopper film 118 is deposited and an interlayer insulating film 119 is deposited. The contact stopper film 118 is preferably a nitride film.

As illustrated in FIGS. 24A to 24C, chemical mechanical polishing is performed to expose an upper portion of the second dummy gate 113a and an upper portion of the first dummy gate 106a.

As illustrated in FIGS. 25A to 25C, the second dummy gate 113a and the first dummy gate 106a are removed.

Figure 26A:
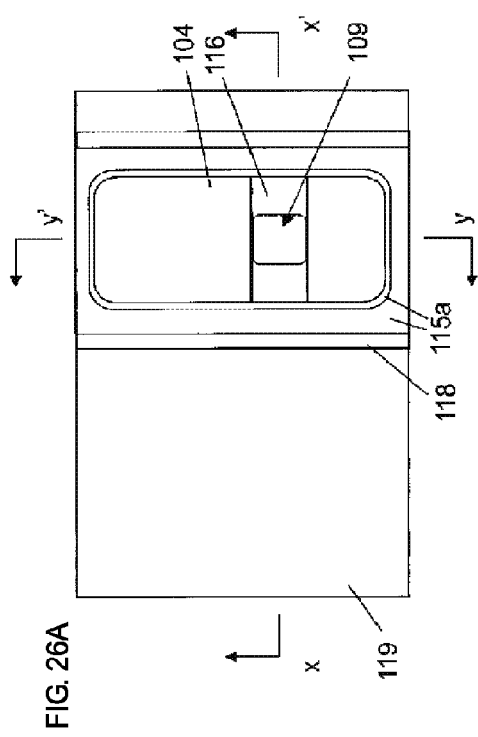
FIG. 26A is a plan view for explaining a method for producing a semiconductor device according to an embodiment of the present invention.
Figure 26C:
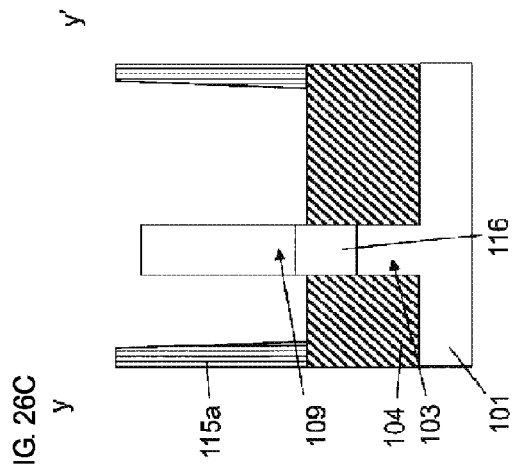
FIG. 26C is a sectional view taken along line Y-Y' in FIG. 26A.
Figure 26B:
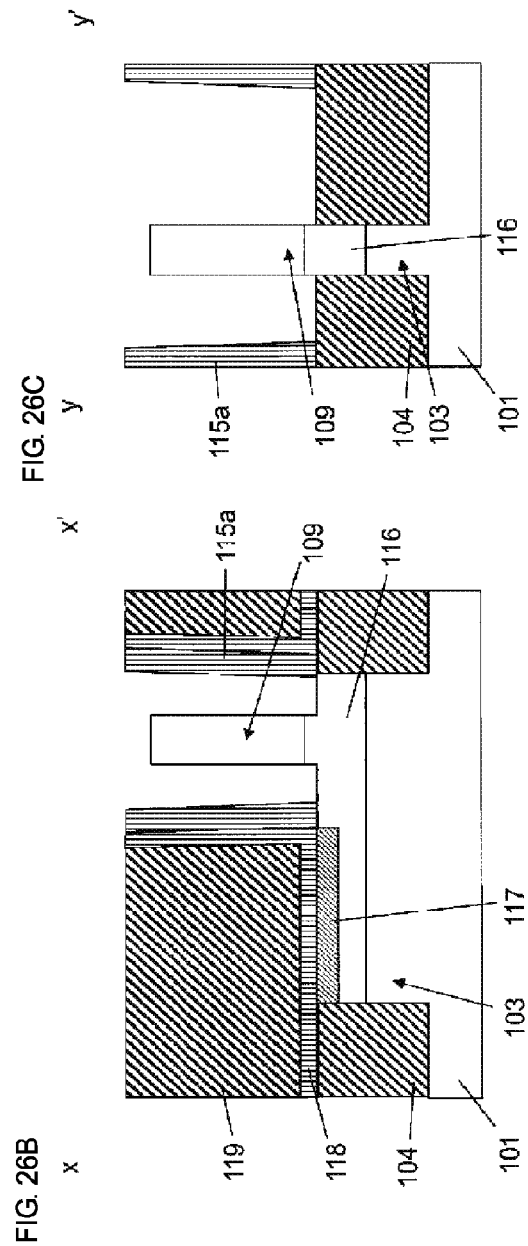
FIG. 26B is a sectional view taken along line X-X' in FIG. 26A.

As illustrated in FIGS. 26A to 26C, the second insulating film 105 and the fourth insulating film 110 are removed.

Figure 27A:
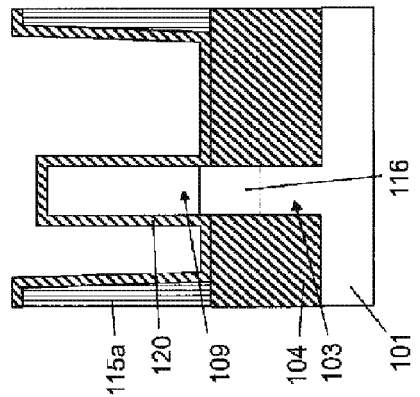
FIG. 27A is a plan view for explaining a method for producing a semiconductor device according to an embodiment of the present invention.
Figure 27B:
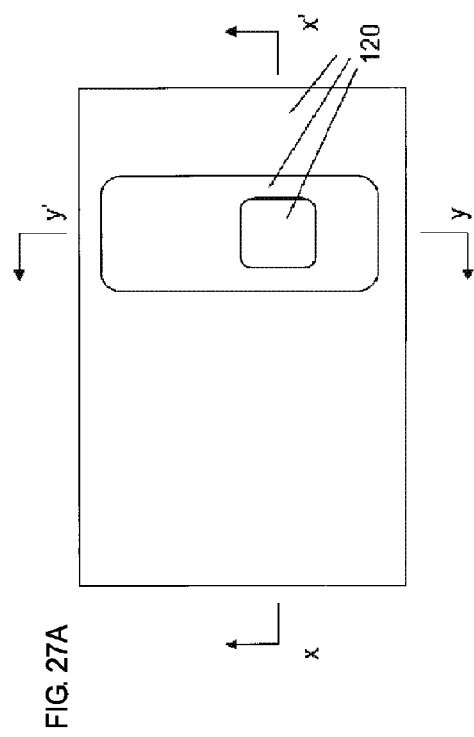
FIG. 27B is a sectional view taken along line X-X' in FIG. 27A.
Figure 27C:
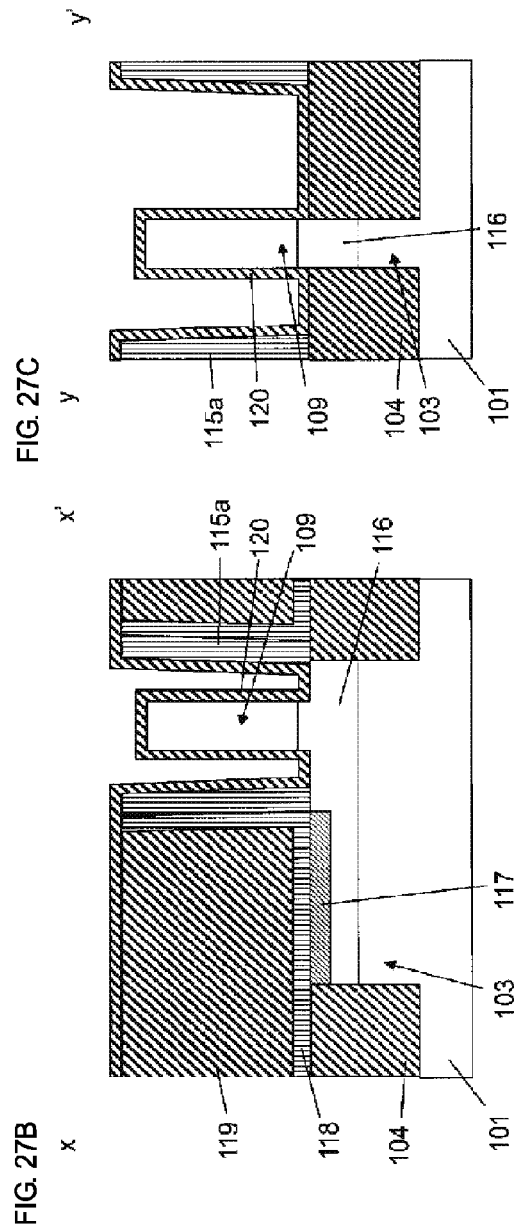
FIG. 27C is a sectional view taken along line Y-Y' in FIG. 27A.

As illustrated in FIGS. 27A to 27C, a first gate insulating film 120 is formed around the pillar-shaped silicon layer 109 and on the inner side of the fifth insulating film 115a.

As illustrated in FIGS. 28A to 28C, a first metal 121 is deposited.

As illustrated in FIGS. 29A to 29C, the first metal 121 is subjected to etch back to expose an upper portion of the pillar-shaped silicon layer 109. Thus, a gate electrode 121a is formed around the pillar-shaped silicon layer 109 and a gate line 121b is formed. The first gate insulating film 120 formed around and under the gate electrode 121a and the gate line 121b enables insulation of the gate electrode 121a and the gate line 121b from the pillar-shaped silicon layer 109 and the fin-shaped silicon layer 103.

Thus, the fifth step has been described, the fifth step including, after the fourth step, depositing an interlayer insulating film, exposing an upper portion of the second dummy gate and an upper portion of the first dummy gate, removing the second dummy gate and the first dummy gate, forming a first gate insulating film around the pillar-shaped semiconductor layer and on an inner side of the fifth insulating film, depositing a first metal, and forming a gate electrode and a gate line.

Hereafter, a sixth step will be described, the sixth step including, after the fifth step, depositing a second gate insulating film around the pillar-shaped semiconductor layer and on the gate electrode and the gate line, removing a portion of the second gate insulating film on the gate line, depositing a second metal, subjecting the second metal to etch back, removing the second gate insulating film on the pillar-shaped semiconductor layer, depositing a third metal, and etching a portion of the third metal and a portion of the second metal to form a first contact formed of the second metal surrounding an upper side wall of the pillar-shaped semiconductor layer such that an upper portion of the first contact is connected to an upper portion of the pillar-shaped semiconductor layer and to form a second contact formed of the second metal on the gate line.

Figure 30C:
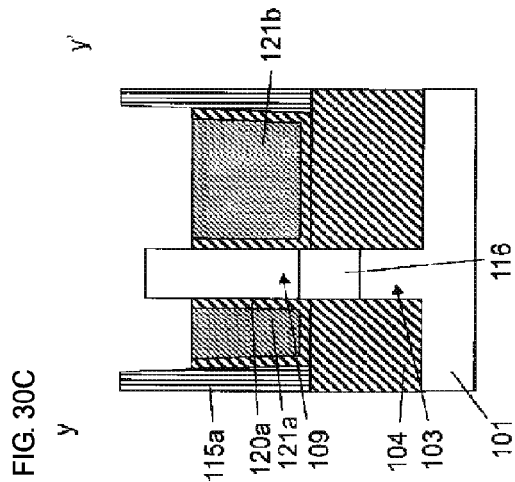
FIG. 30C is a sectional view taken along line Y-Y' in FIG. 30A.
Figure 30A:
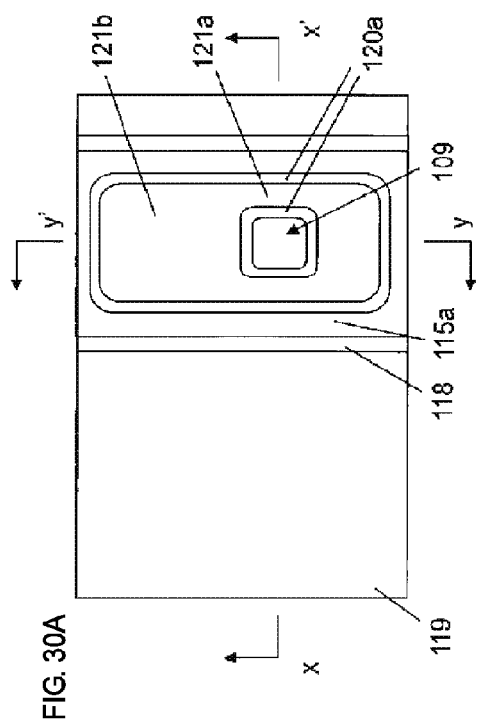
FIG. 30A is a plan view for explaining a method for producing a semiconductor device according to an embodiment of the present invention.
Figure 30B:
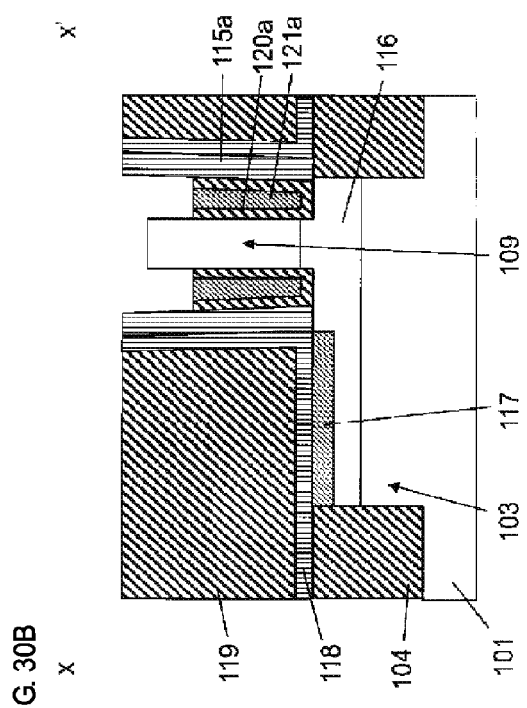
FIG. 30B is a sectional view taken along line X-X' in FIG. 30A.

As illustrated in FIGS. 30A to 30C, the exposed portion of the first gate insulating film 120 is removed. As a result, the first gate insulating film 120 is left as a first gate insulating film 120a.

Figure 31A:
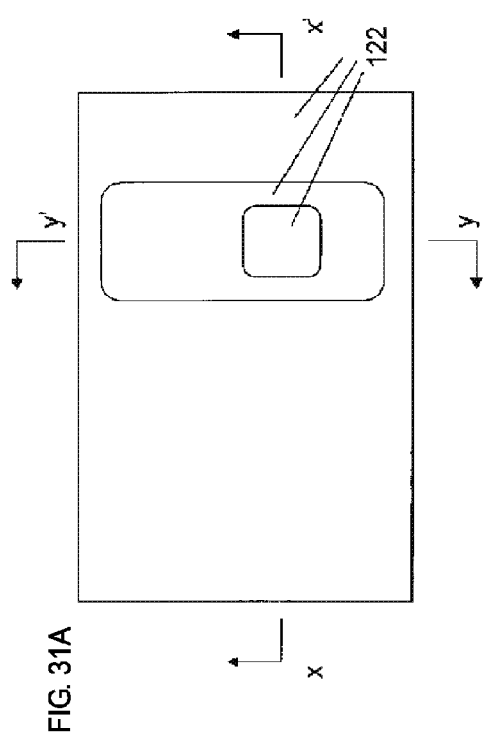
FIG. 31A is a plan view for explaining a method for producing a semiconductor device according to an embodiment of the present invention.
Figure 31C:
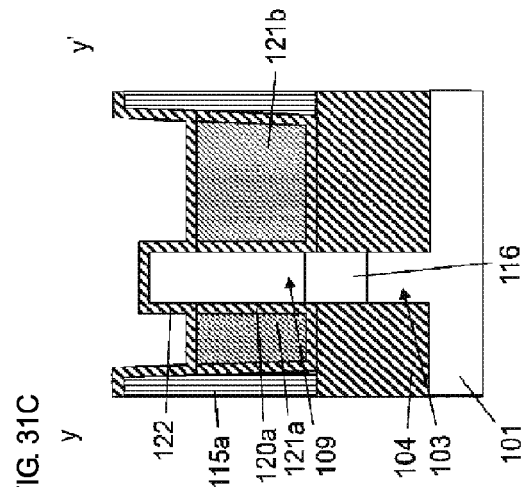
FIG. 31C is a sectional view taken along line Y-Y' in FIG. 31A.
Figure 31B:
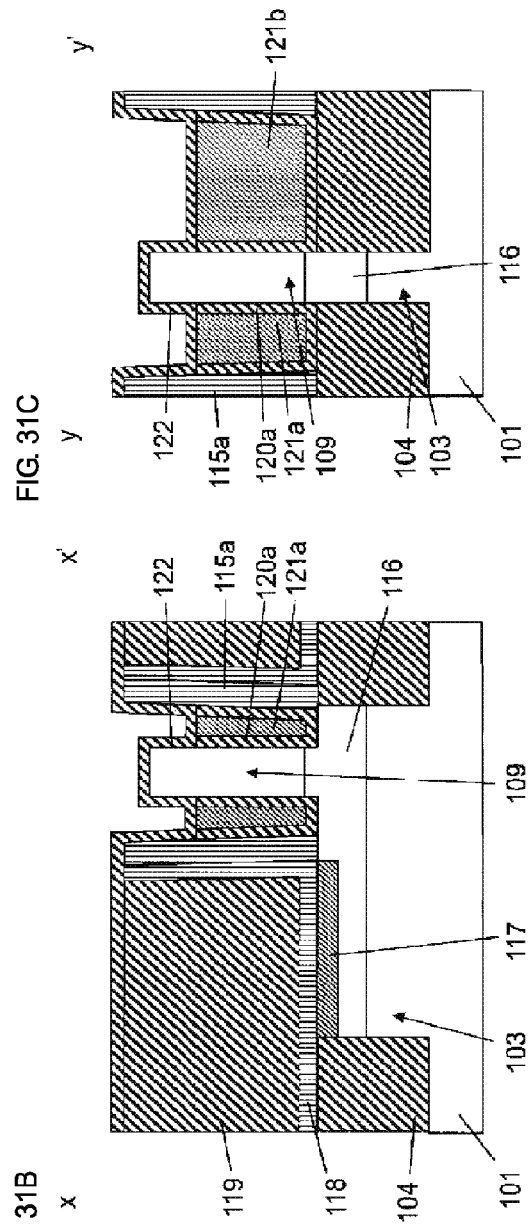
FIG. 31B is a sectional view taken along line X-X' in FIG. 31A.

As illustrated in FIGS. 31A to 31C, a second gate insulating film 122 is deposited around the pillar-shaped silicon layer 109 and on the gate electrode 121a and the gate line 121b.

Figure 32A:
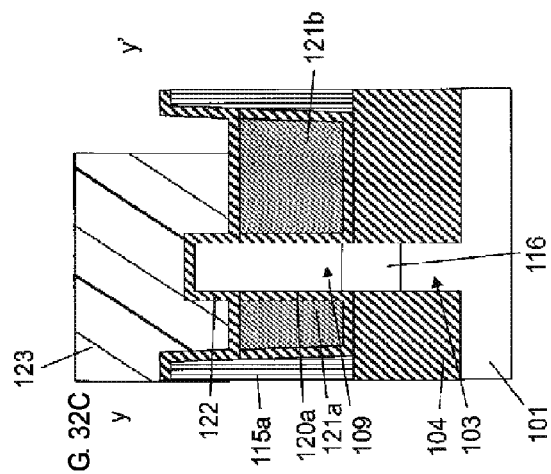
FIG. 32A is a plan view for explaining a method for producing a semiconductor device according to an embodiment of the present invention.
Figure 32B:
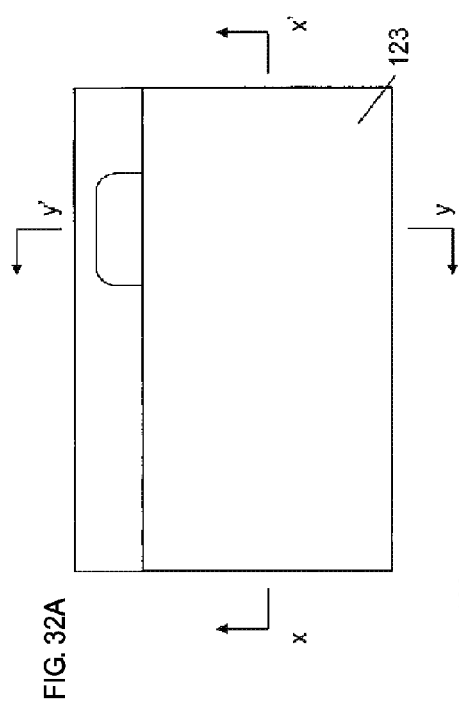
FIG. 32B is a sectional view taken along line X-X' in FIG. 32A.
Figure 32C:
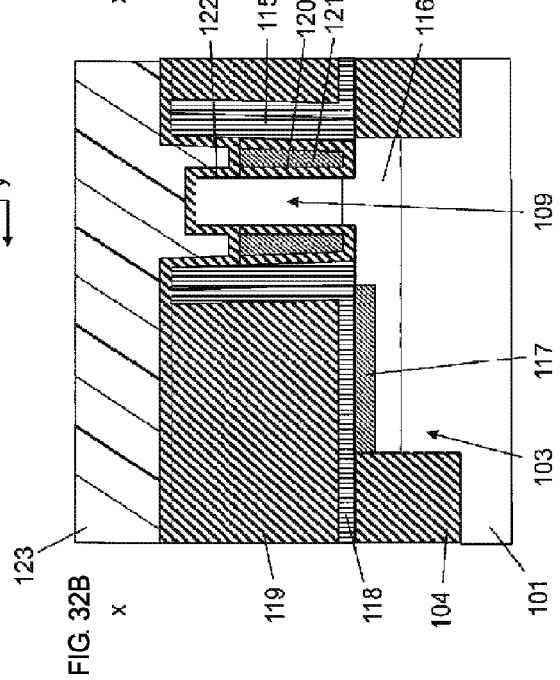
FIG. 32C is a sectional view taken along line Y-Y' in FIG. 32A.

As illustrated in FIGS. 32A to 32C, a third resist 123 for removing a portion of the second gate insulating film 122 on the gate line 121b is formed.

Figure 33A:
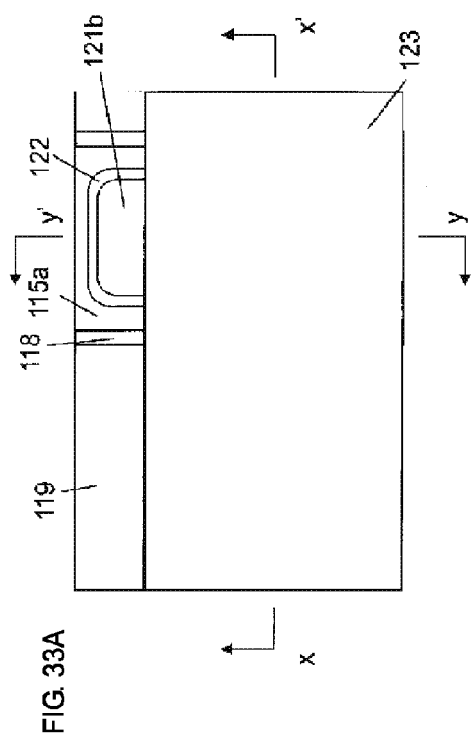
FIG. 33A is a plan view for explaining a method for producing a semiconductor device according to an embodiment of the present invention.
Figure 33C:
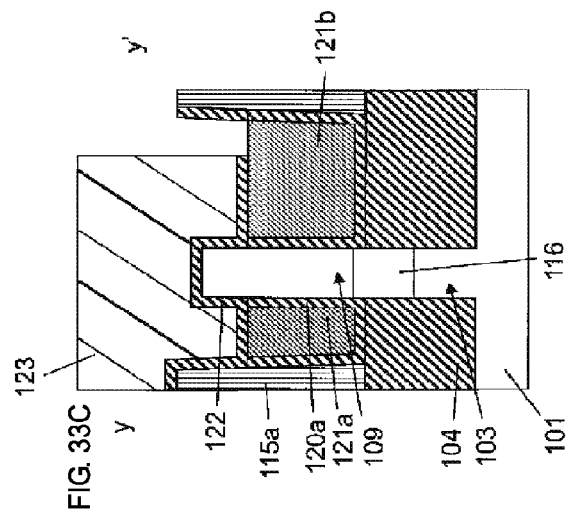
FIG. 33C is a sectional view taken along line Y-Y' in FIG. 33A.
Figure 33B:
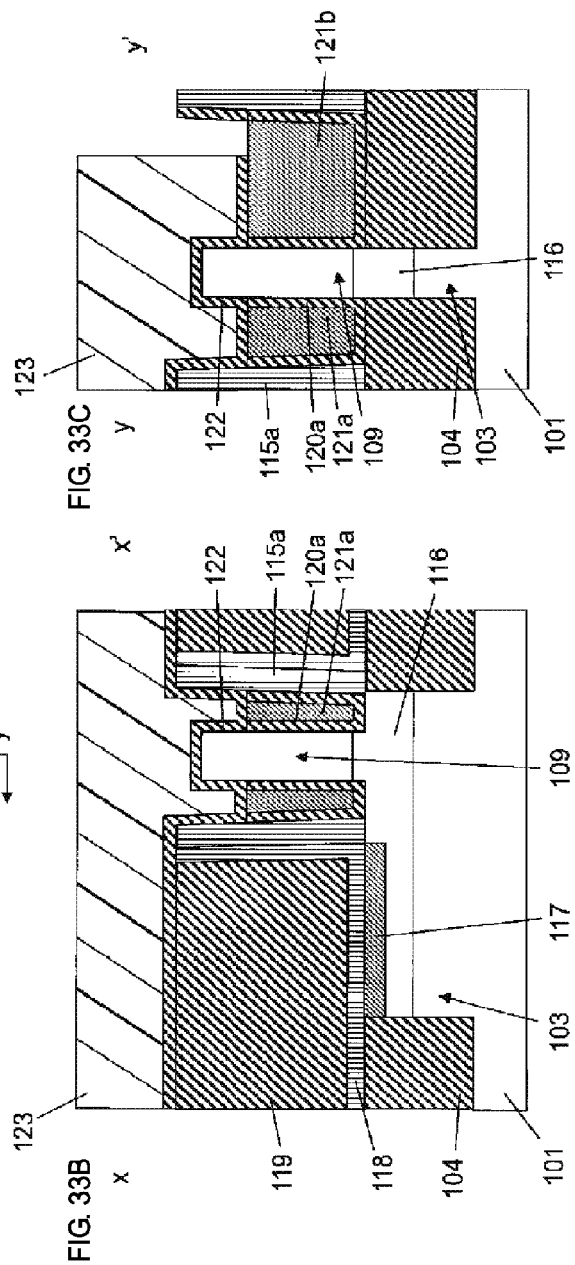
FIG. 33B is a sectional view taken along line X-X' in FIG. 33A.

As illustrated in FIGS. 33A to 33C, the portion of the second gate insulating film 122 on the gate line 121b is removed.

As illustrated in FIGS. 34A to 34C, the third resist 123 is removed.

Figure 35A:
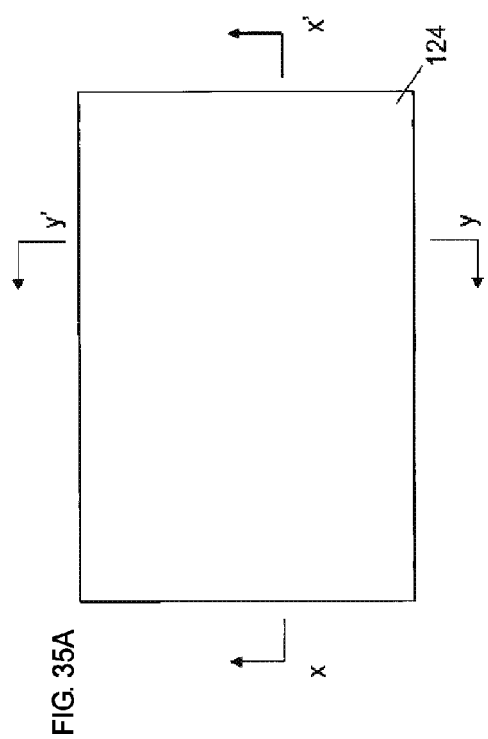
FIG. 35A is a plan view for explaining a method for producing a semiconductor device according to an embodiment of the present invention.
Figure 35C:
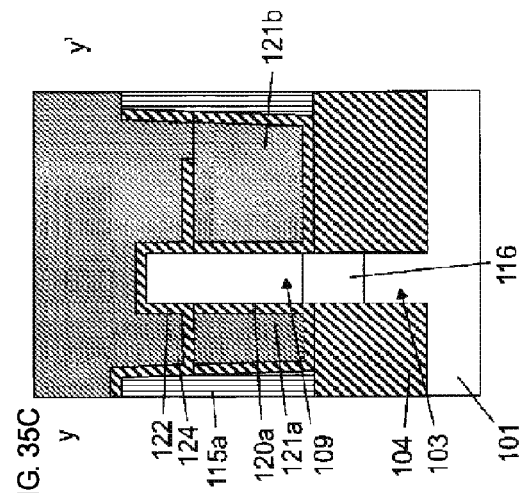
FIG. 35C is a sectional view taken along line Y-Y' in FIG. 35A.
Figure 35B:
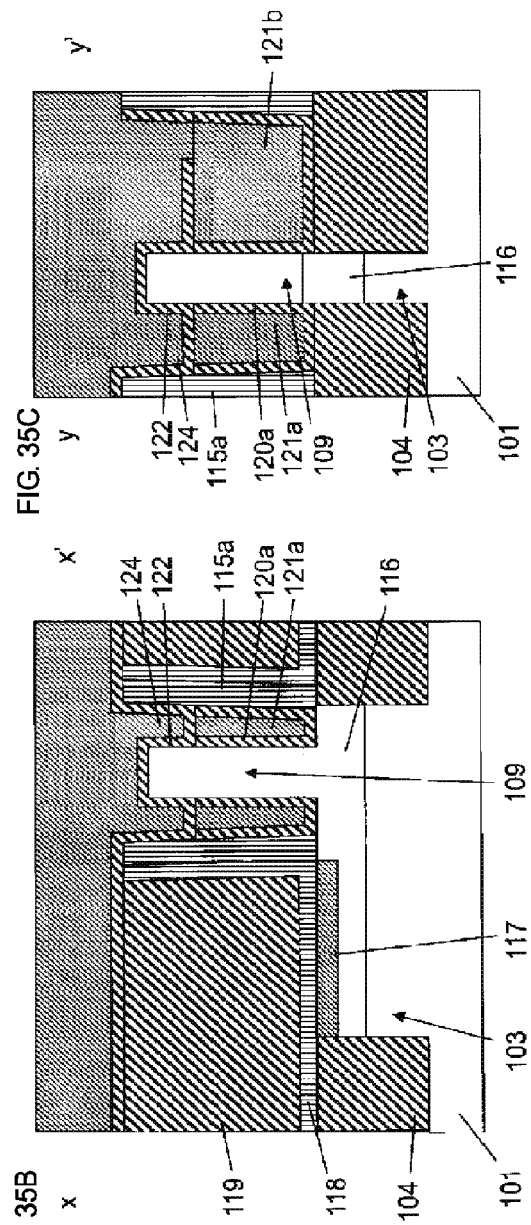
FIG. 35B is a sectional view taken along line X-X' in FIG. 35A.

As illustrated in FIGS. 35A to 35C, a second metal 124 is deposited. When an n-type transistor is formed, a second metal 124 preferably has a work function of 4.0 eV to 4.2 eV. When a p-type transistor is formed, the second metal 124 preferably has a work function of 5.0 eV to 5.2 eV.

Figure 36A:
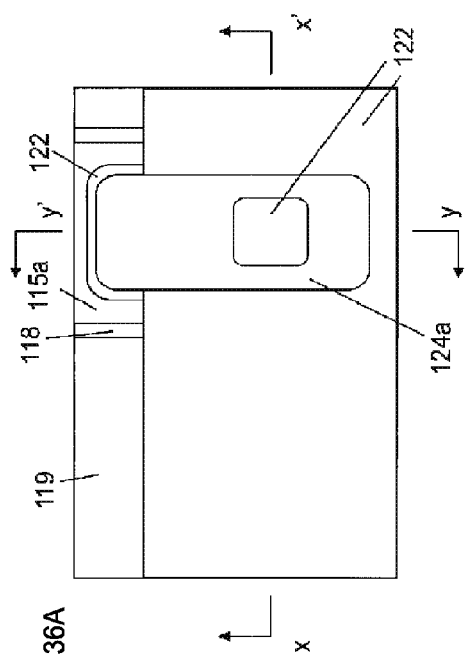
FIG. 36A is a plan view for explaining a method for producing a semiconductor device according to an embodiment of the present invention.
Figure 36C:
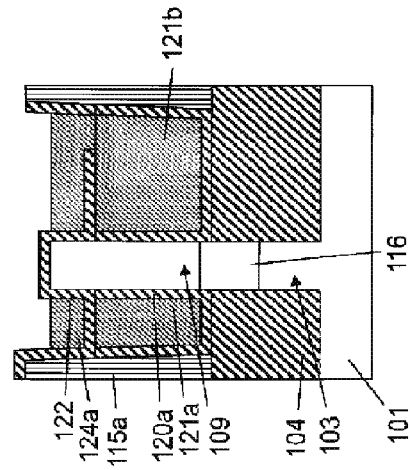
FIG. 36C is a sectional view taken along line Y-Y' in FIG. 36A.
Figure 36B:
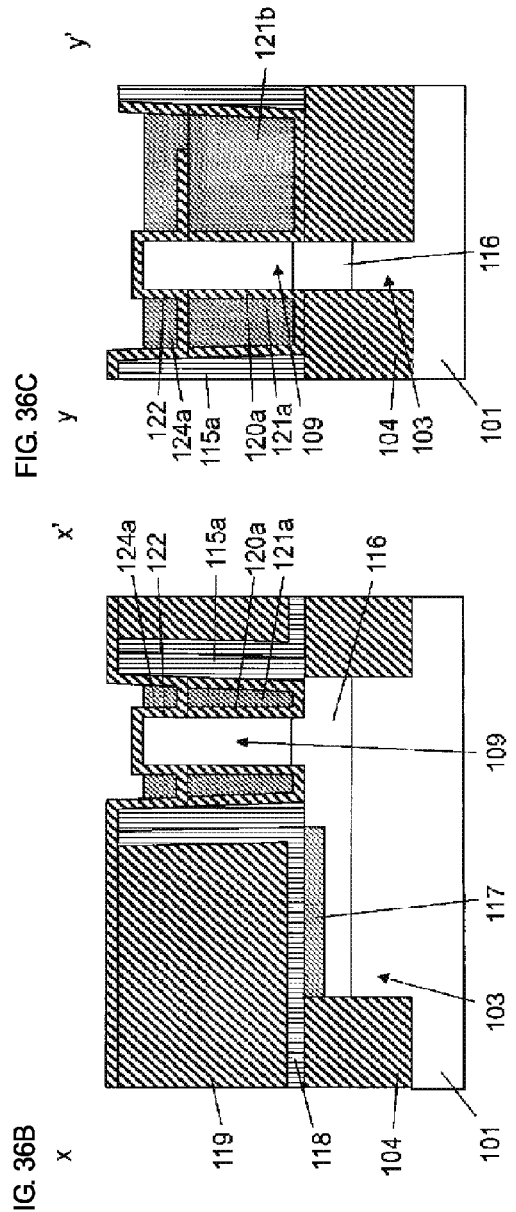
FIG. 36B is a sectional view taken along line X-X' in FIG. 36A.

As illustrated in FIGS. 36A to 36C, the second metal 124 is subjected to etch back to form a contact line 124a.

As illustrated in FIGS. 37A to 37C, a portion of the second gate insulating film 122 on the pillar-shaped silicon layer 109 is removed. Thus, the second gate insulating film 122 is left as a second gate insulating film 122a.

Figure 38A:
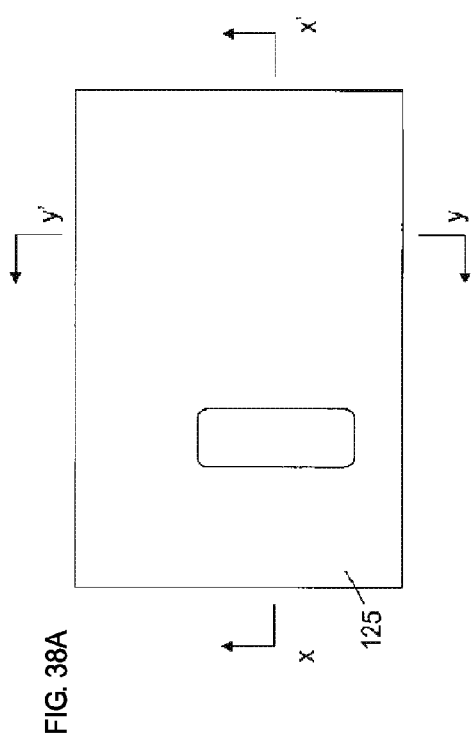
FIG. 38A is a plan view for explaining a method for producing a semiconductor device according to an embodiment of the present invention.
Figure 38C:
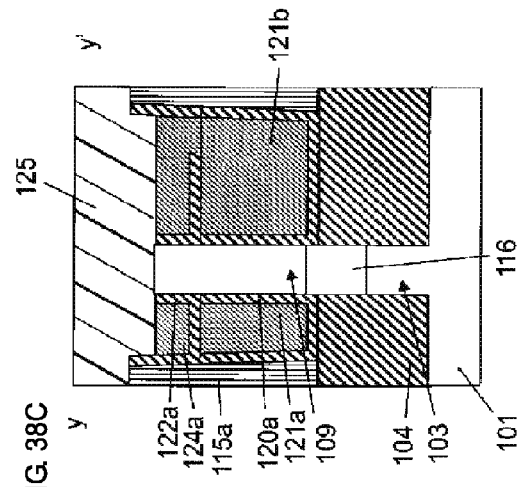
FIG. 38C is a sectional view taken along line Y-Y' in FIG. 38A.
Figure 38B:
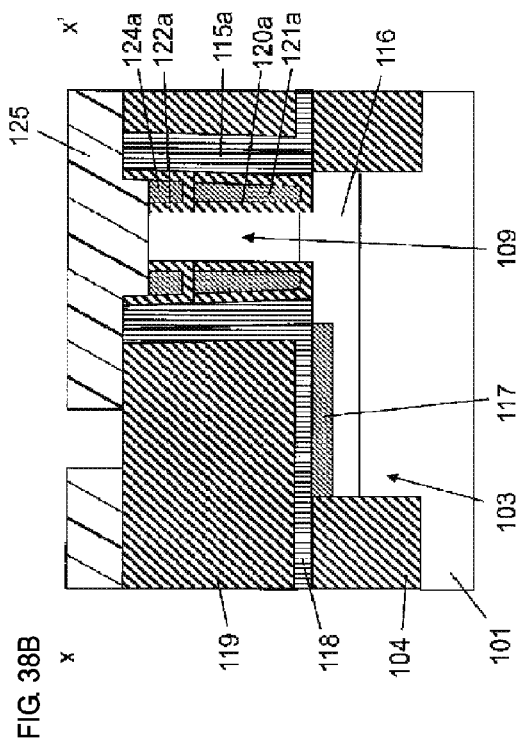
FIG. 38B is a sectional view taken along line X-X' in FIG. 38A.

As illustrated in FIGS. 38A to 38C, a fourth resist 125 for forming a contact hole is formed.

Figure 39A:
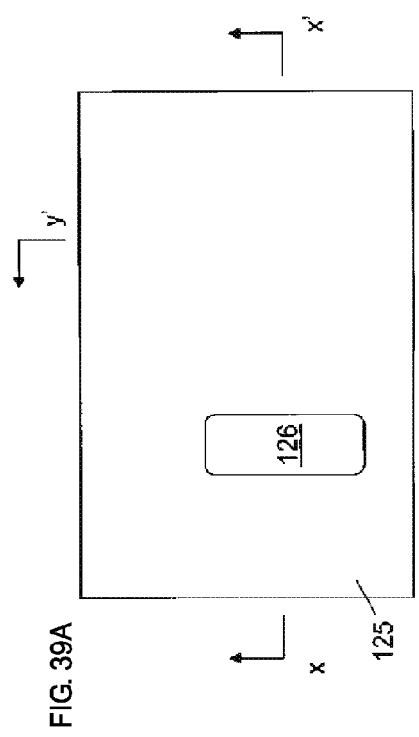
FIG. 39A is a plan view for explaining a method for producing a semiconductor device according to an embodiment of the present invention.
Figure 39C:
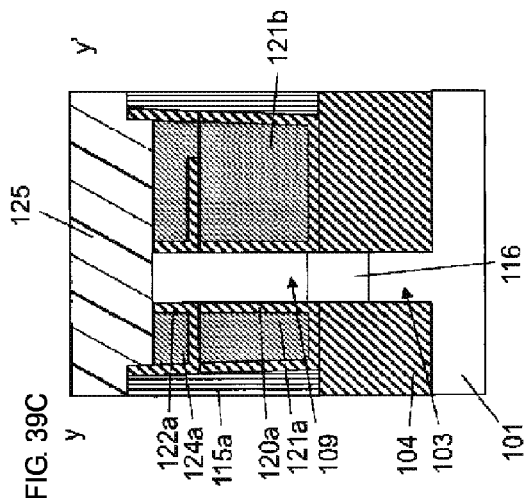
FIG. 39C is a sectional view taken along line Y-Y' in FIG. 39A.
Figure 39B:
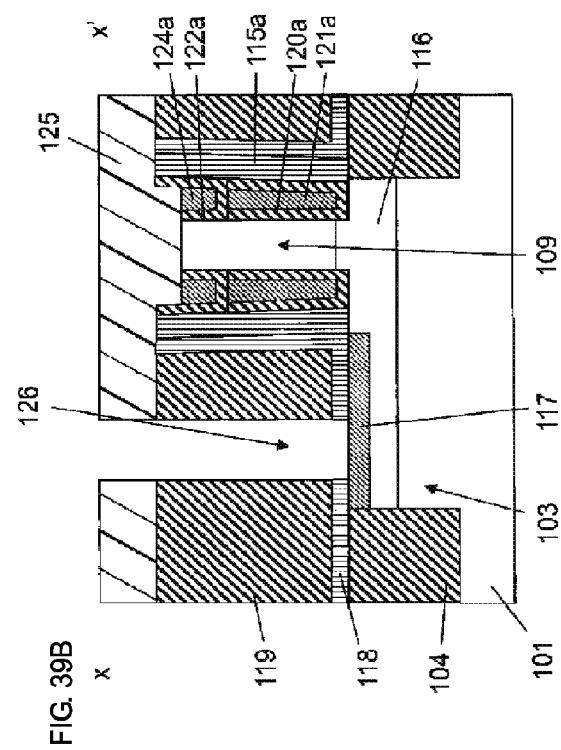
FIG. 39B is a sectional view taken along line X-X' in FIG. 39A.

As illustrated in FIGS. 39A to 39C, the interlayer insulating film 119 and the contact stopper film 118 are etched to for in a contact hole 126.

As illustrated in FIGS. 40A to 40C, the fourth resist 125 is removed.

Figure 41A:
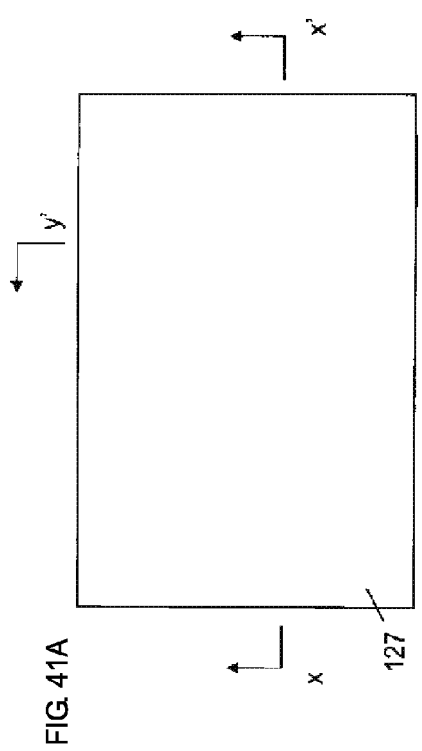
FIG. 41A is a plan view for explaining a method for producing a semiconductor device according to an embodiment of the present invention.
Figure 41C:
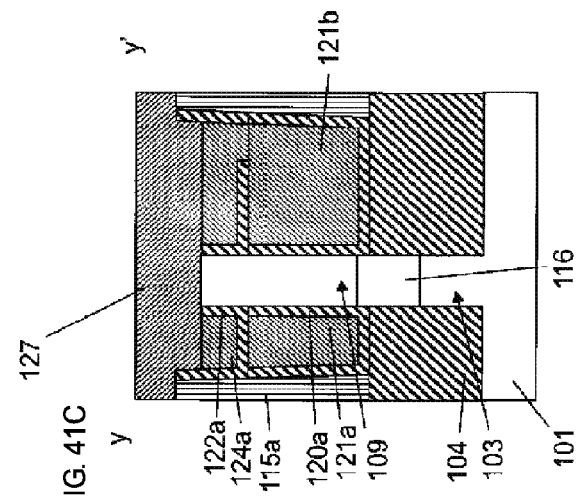
FIG. 41C is a sectional view taken along line Y-Y' in FIG. 41A.
Figure 41B:
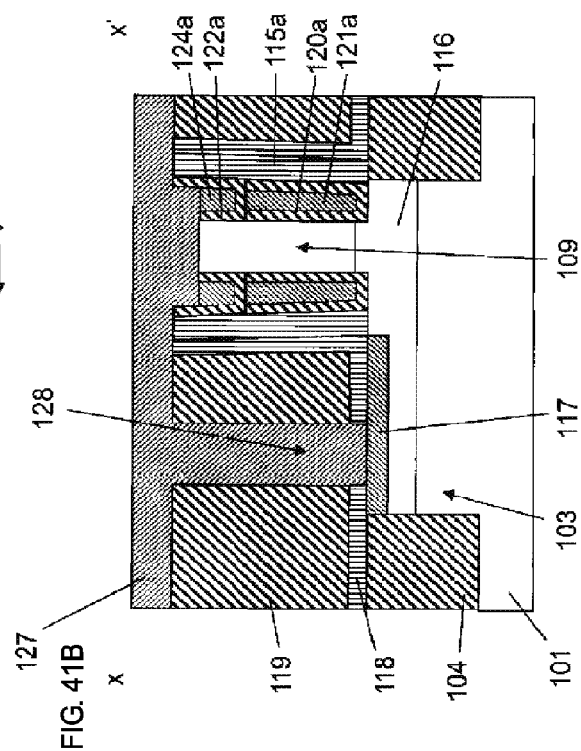
FIG. 41B is a sectional view taken along line X-X' in FIG. 41A.

As illustrated in FIGS. 41A to 41C, a third metal 127 is deposited. As a result, a third contact 128 is formed.

Figure 42A:
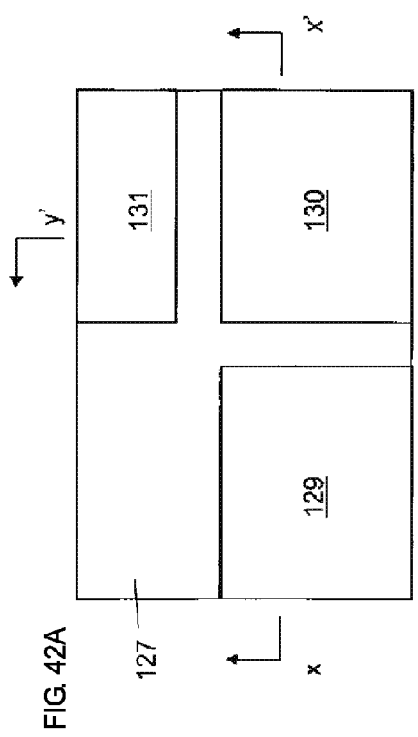
FIG. 42A is a plan view for explaining a method for producing a semiconductor device according to an embodiment of the present invention.
Figure 42C:
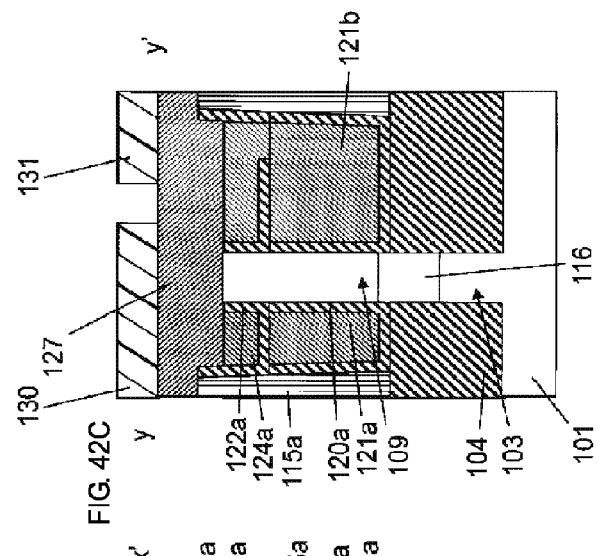
FIG. 42C is a sectional view taken along line Y-Y' in FIG. 42A.
Figure 42B:
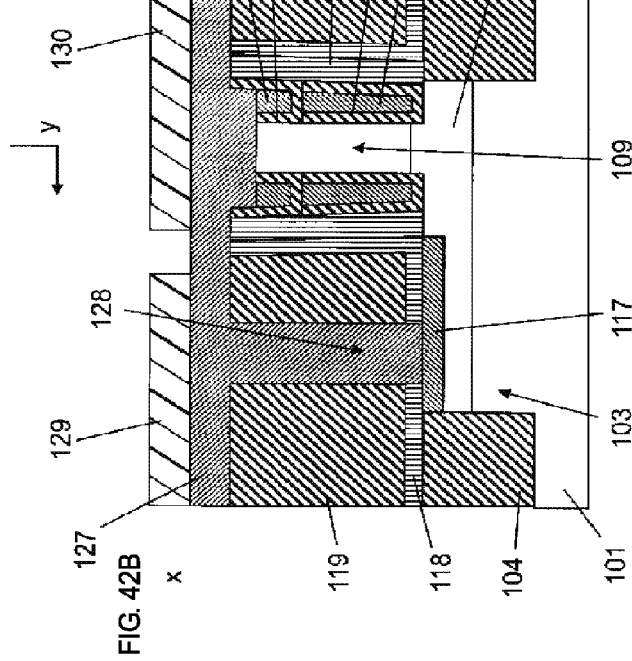
FIG. 42B is a sectional view taken along line X-X' in FIG. 42A.

As illustrated in FIGS. 42A to 42C, fifth resists 129, 130, and 131 are formed.

As illustrated in FIGS. 43A to 43C, the third metal 127 and the contact line 124a are etched to form a first contact 124b fainted of the second metal surrounding the upper side wall of the pillar-shaped silicon layer 109, a second contact 124c formed of the second metal on the gate line 121b, and metal wirings 127a, 128b, and 128c. The upper portion of the first contact 124b is connected to the upper portion of the pillar-shaped silicon layer 109 via the metal wiring 127b.

As illustrated in FIGS. 44A to 44C, the fifth resists 129, 130, and 131 are removed.

Thus, the sixth step has been described, the sixth step including, after the fifth step, depositing a second gate insulating film around the pillar-shaped semiconductor layer and on the gate electrode and the gate line, removing a portion of the second gate insulating film on the gate line, depositing a second metal, subjecting the second metal to etch back, removing the second gate insulating film on the pillar-shaped semiconductor layer, depositing a third metal, and etching a portion of the third metal and a portion of the second metal to form a first contact formed of the second metal surrounding an upper side wall of the pillar-shaped semiconductor layer such that an upper portion of the first contact is connected to an upper portion of the pillar-shaped semiconductor layer and to form a second contact formed of the second metal on the gate line.

Thus, an SGT production method has been described, the method employing a gate last process in which two masks are used to form a fin-shaped semiconductor layer, a pillar-shaped semiconductor layer, a gate electrode, and a gate line.

FIGS. 1A to 1C illustrate the structure of a semiconductor device obtained by the above-described production method.

The semiconductor device in FIGS. 1A to 1C includes a fin-shaped silicon layer 103 formed on a silicon substrate 101; a first insulating film 104 formed around the fin-shaped silicon layer; a pillar-shaped silicon layer 109 formed on the fin-shaped silicon layer 103; a first gate insulating film 120a formed around the pillar-shaped silicon layer 109; a gate electrode 121a formed of metal and formed around the first gate insulating film 120a; a gate line 121b connected to the gate electrode 121a, extending in a direction orthogonal to the fin-shaped silicon layer 103, and formed of metal; the first gate insulating film 120a formed around and under the gate electrode 121a and the gate line 121b; a second diffusion layer 116 formed in an upper portion of the fin-shaped silicon layer 103 and a lower portion of the pillar-shaped silicon layer 109; a second gate insulating film 122a formed around an upper side wall of the pillar-shaped silicon layer 109; and a first contact 124b formed around the second gate insulating film 122a and formed of a second metal, wherein an upper portion of the first contact 124b is connected to an upper portion of the pillar-shaped silicon layer 109, the gate electrode 121a has a top surface and a bottom surface, the top surface having a larger area than the bottom surface, and the gate line 121b has a top surface and a bottom surface, the top surface having a larger area than the bottom surface.

The semiconductor device further includes a second contact 124c formed of the second metal on the gate line 121b.

Since the pillar-shaped silicon layer 109 and the gate line 121b are formed in a self-alignment manner, misalignment therebetween is prevented.

The gate insulating film 120a formed around and under the gate electrode 121a and the gate line 121b enables insulation of the gate electrode 121a and the gate line 121b from the pillar-shaped silicon layer 109 and the fin-shaped silicon layer 103.

Note that the present invention encompasses various embodiments and modifications without departing from the broad spirit and scope of the present invention. The above-described embodiments are used to describe examples of the present invention and do not limit the scope of the present invention.

For example, a method for producing a semiconductor device in which the p-type (including $p^+$ type) and the n-type (including $n^+$ type) in the above-described embodiment are changed to the opposite conductivity types and a semiconductor device produced by this method are obviously within the technical scope of the present invention.

What is claimed is:

1. A method of producing a semiconductor device, the method comprising:
   a first step of forming a fin-shaped semiconductor layer on a semiconductor substrate and forming a first insulating film around the fin-shaped semiconductor layer;
   a second step, after the first step, of forming a second insulating film around the fin-shaped semiconductor layer,
      depositing a first polysilicon on the second insulating film, planarizing the first polysilicon, forming a third insulating film on the first polysilicon,
      forming a resist for forming a gate line and a pillar-shaped semiconductor layer, to extend perpendicular to a direction in which the fin-shaped semiconductor layer extends, and
      etching the third insulating film, the first polysilicon, the second insulating film, and the fin-shaped semiconductor layer to form a pillar-shaped semiconductor layer, a first dummy gate formed from the first polysilicon, and a first hard mask formed from the third insulating film;
   a third step, after the second step, of forming a fourth insulating film around the pillar-shaped semiconductor layer and the first dummy gate, depositing a second polysilicon around the fourth insulating film, planarizing the second polysilicon, etching back the second polysilicon to expose the first hard mask, depositing a sixth insulating film, etching the sixth insulating film to form a second hard mask on a side wall of the first hard mask, and etching the second polysilicon so as to remain on a side wall of the first dummy gate and a side wall of the pillar-shaped semiconductor layer to form a second dummy gate;
   a fourth step, after the third step, of forming a sidewall by processing a fifth insulating film so as to have a sidewall shape around the second dummy gate, forming a second diffusion layer in an upper portion of the fin-shaped semiconductor layer and a lower portion of the pillar-shaped semiconductor layer, and forming a metal-semiconductor compound on the second diffusion layer;
   a fifth step, after the fourth step, of depositing an interlayer insulating film, exposing an upper portion of the second dummy gate and an upper portion of the first dummy gate, removing the second dummy gate and the first dummy gate, forming a first gate insulating film around the pillar-shaped semiconductor layer and on an inner side of the fifth insulating film, depositing a first metal, and forming a gate electrode and a gate line; and a sixth step, after the fifth step, of depositing a second gate insulating film around the pillar-shaped semiconductor layer and on the gate electrode and the gate line, removing a portion of the second gate insulating film on the gate line, depositing a second metal, subjecting the second metal to etch back, removing the second gate insulating film on the pillar-shaped semiconductor layer, depositing a third metal, and etching a portion of the third metal and a portion of the second metal to form a first contact formed of the second metal surrounding an upper side wall of the pillar-shaped semiconductor layer such that an upper portion of the first contact is connected to an upper portion of the pillar-shaped semiconductor layer and to form a second contact forming of the second metal on the gate line.

2. The method for producing a semiconductor device according to claim 1, wherein the second dummy gate has a top surface and a bottom surface, the top surface having a larger area than the bottom surface.

3. The method for producing a semiconductor device according to claim 1, wherein the second step comprises:
   forming the second insulating film around the fin-shaped semiconductor layer;
   depositing the first polysilicon on the second insulating film and planarizing the first polysilicon;
   forming the resist for the gate line and the pillar-shaped semiconductor layer to extend perpendicular to the direction in which the fin-shaped semiconductor layer extends; and
   etching the first polysilicon, the second insulating film, and the fin-shaped semiconductor layer to form the pillar-shaped semiconductor layer and the first dummy gate formed of the first polysilicon.

4. The method for producing a semiconductor device according to claim 1, wherein the fourth step comprises forming the fifth insulating film around the second dummy gate and etching the first insulating film so as to have a sidewall shape to form the sidewall from the fifth insulating film, forming the second diffusion layer in the upper portion of the fin-shaped semiconductor layer and the lower portion of the pillar-shaped semiconductor layer, and forming the metal-semiconductor compound on the second diffusion layer.

5. The method for producing a semiconductor device according to claim 4, wherein the fifth step comprises depositing the interlayer insulating film and subjecting to chemical mechanical polishing to expose the upper portion of the second dummy gate and the upper portion of the first dummy gate, removing the second dummy gate and the first dummy gate, removing the second insulating film and the fourth insulating film, forming the first gate insulating film around the pillar-shaped semiconductor layer and on the inner side of the fifth insulating film, and depositing and etching back the first metal to form the gate electrode and the gate line.

6. The method for producing a semiconductor device according to claim 4, which further comprises depositing a contact stopper film after the fourth step.

7. The method for producing a semiconductor device according to claim 1, which further comprises removing the first gate insulating film after the fifth step.

8. The method for producing a semiconductor device according to claim 1, wherein the metal of the first contact has a work function of 4.0 eV to 4.2 eV.

9. The method for producing a semiconductor device according to claim 1, wherein the metal of the first contact has a work function of 5.0 eV to 5.2 eV.

* * * * *

UNITED STATES PATENT AND TRADEMARK OFFICE
CERTIFICATE OF CORRECTION

PATENT NO. : 9,755,053 B2
APPLICATION NO. : 15/467676
DATED : September 5, 2017
INVENTOR(S) : Fujio Masuoka et al.

It is certified that error appears in the above-identified patent and that said Letters Patent is hereby corrected as shown below:

In the Claims

Claim 1, Column 15, Line 15 - delete "forming" and replace with "formed"

Signed and Sealed this
Twenty-eighth Day of May, 2019

Andrei Iancu
*Director of the United States Patent and Trademark Office*